(12) United States Patent
Tamura

(10) Patent No.: US 8,010,825 B2
(45) Date of Patent: Aug. 30, 2011

(54) JITTER REDUCTION CIRCUIT

(75) Inventor: Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1008 days.

(21) Appl. No.: 11/896,221

(22) Filed: Aug. 30, 2007

(65) Prior Publication Data

US 2008/0054966 A1    Mar. 6, 2008

(30) Foreign Application Priority Data

Sep. 5, 2006   (JP) .................................. 2006-240080

(51) Int. Cl.
*G06F 1/04* (2006.01)
(52) U.S. Cl. ............................ 713/503; 333/20; 333/164
(58) Field of Classification Search .................... 333/20, 333/164; 713/503
See application file for complete search history.

(56) References Cited

U.S. PATENT DOCUMENTS

| 4,855,696 | A  | * | 8/1989 | Tan et al. ......................... 333/20 |
| 6,768,342 | B2 | * | 7/2004 | Greenstreet et al. ............ 326/93 |
| 7,532,083 | B2 | * | 5/2009 | Hannah ............................ 333/20 |

FOREIGN PATENT DOCUMENTS

JP    2001-044976    2/2001

* cited by examiner

*Primary Examiner* — Albert Wang
(74) *Attorney, Agent, or Firm* — Arent Fox LLP

(57) ABSTRACT

A jitter reduction circuit includes a signal line transmitting a first signal and having a plurality of sections, and a plurality of delay lines transmitting a second signal and provided in one-to-one correspondence to the sections of the signal line, wherein the plurality of delay lines is configured such that a delay of the second signal on a given one of the delay lines is set to a first delay in response to a first level of the first signal in a corresponding one of the sections, and is set to a second delay in response to a second level of the first signal in the corresponding one of the sections.

13 Claims, 23 Drawing Sheets

JITTER REDUCTION CIRCUIT

CROSS-REFERENCE TO RELATED APPLICATIONS

The present application is based upon and claims the benefit of priority from the prior Japanese Patent Application No. 2006-240080 filed on Sep. 5, 2006, with the Japanese Patent Office, the entire contents of which are incorporated herein by reference.

BACKGROUND

1. Field

The embodiment generally relates to circuits restoring the shape of a pulse signal, and particularly relates to a circuit for reducing the jitter of a pulse signal.

2. Description of the Related Art

Due to the improvement of performance of information processing equipment such as communication apparatuses and servers used in communication trunk lines, it becomes necessary to increase the data rate of information transmission inside as well as between the equipments. For example, transmission speed needs to be improved by using higher frequency signals for signal transmission between devices and circuit blocks inside a chip, for signal transmission between chips such as between a processor chip and a memory chip like SRAM or DRAM, for signal transmission between boards, and for signal transmission between information apparatuses.

An increase in signal frequency, however, results in the signal waveform being distorted due to the attenuation of high frequency components resulting from the effect of the frequency characteristics of amplifiers and buffers as well as wire resistance inside a chip. Further, signal quality degrades due to crosstalk, ground bounce, and the like. Outside the chip, also, signal waveforms are distorted due to the frequency characteristics of coupling cables.

In order to compensate for the degradation of signal quality (i.e., the distortion of signal waveform), it is not sufficient to merely insert an amplifier (e.g., a limiting amplifier) for the purpose of restoring a signal level. This is because such amplifier cannot compensate for timing fluctuation (i.e., timing jitter). The restoration of signal timing is thus necessary in addition to the restoration of signal level. In order to restore signal quality inside a chip, generally, provision is made to arrange flip-flops operating with a small-jitter clock along the signal transmission lines, so that these flip-flops restore the level and timing of signals.

When the signal frequency becomes as high as several GHz to several tens of GHz, however, it becomes difficult to design and manufacture flip-flops that can properly operate at such high frequency. If flip-flops satisfying such needs are successfully manufactured, the size and power consumption would be prohibitively large. A level-restoring circuit (repeater) may be implemented as a combination of an ordinary high-speed I/O receiver and transmitter. With such configuration, the circuit size will also be prohibitively large, and the cost will increase.

The operation by a flip-flop restoring the level and timing of a signal is comprised of two steps, i.e., the sampling of an input signal at clock-edge timing and the restoring of the level of the input signal by use of a restoration-type amplifier or limiting amplifier. In this case, almost all the energy of the input signal is discarded, and the restoring-type amplifier reconstructs its output signal almost from scratch. Accordingly, the restoration of a signal level by use of a flip-flop is, in principle, an act of wastefully consuming electric power. Further, the sample circuit for sampling the input signal into the flip-flop needs to have the sampling interval thereof set sufficiently shorter than the clock cycle, which makes it difficult to increase operating frequency.

Accordingly, there is a need for a jitter reduction circuit that can restore the level and timing of signal efficiently in terms of power consumption, circuit size, and cost even when higher signal frequency is used.

[Patent Document 1] Japanese Patent Application Publication No. 2001-44976

SUMMARY EMBODIMENT

The embodiment provides that a jitter reduction circuit including a signal line transmitting a first signal and having a plurality of sections, and a plurality of delay lines transmitting a second signal and provided in one-to-one correspondence to the sections of the signal line, wherein the plurality of delay lines is configured such that a delay of the second signal on one of the delay lines is set to a first delay in response to a first level of the first signal in a corresponding one of the sections, and is set to a second delay in response to a second level of the first signal in the corresponding one of the sections.

BRIEF DESCRIPTION OF THE DRAWINGS

Other objects and further features of the embodiment will be apparent from the following detailed description when read in conjunction with the accompanying drawings, in which.

DESCRIPTION OF THE PREFERRED EMBODIMENTS

Figure 1:
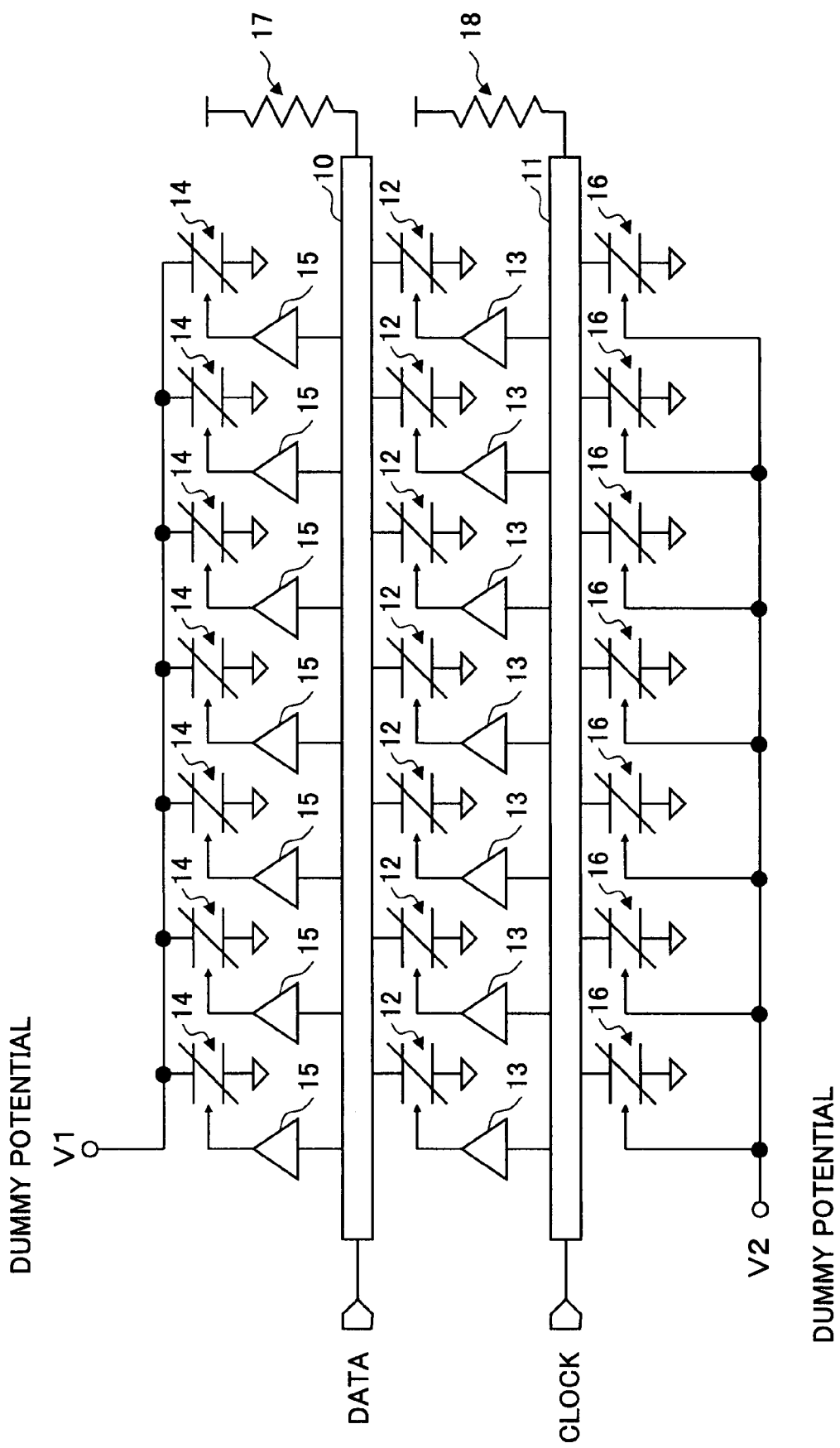
FIG. 1 is a drawing for explaining the principle of a jitter reduction circuit according to one embodiment.

FIG. 1 is a drawing for explaining the principle of a jitter reduction circuit according to one embodiment. The jitter reduction circuit show in FIG. 1 includes, as a non-limiting example, a signal transmission line 10 functioning as a delay line, a signal transmission line 11 functioning as a delay line, a plurality of variable capacitors 12 as an example of a device for adjusting a delay, a plurality of amplifiers 13 as an example of a device for controlling the variable capacitors 12, variable capacitors 14 equivalent to the variable capacitors 12, amplifiers 15 equivalent to the amplifiers 13, and variable capacitors 16 equivalent to the variable capacitors 12. One end of each of the signal transmission lines 10 and 11 is terminated by resistors 17 and 18, respectively.

A data signal propagates through the signal transmission line 10. The data signal represents information by the binary values "HIGH" and "LOW", and the signal level transition between HIGH and LOW is supposed to be in synchronization with a clock signal. Namely, a signal transmission end generates a data signal as a signal having the changes of signal level synchronized with a clock signal, and transmits the generated data signal to the signal transmission line 10. A signal receiving end receives the data signal through the signal transmission line 10, and detects the received data signal in synchronization with the clock signal.

The clock signal propagates through the signal transmission line 11. The signal transmission line 10 and the signal transmission line 11 run parallel to each other. The propagation speed of a data signal propagating through the signal transmission line 10 changes in response to the signal level of a clock signal propagating through the signal transmission line 11. In the example shown in FIG. 1, the input ends of the amplifiers 13 are coupled to the signal transmission line 11, and the amplifiers 13 output signal levels responsive to the signal levels of the clock signal observed at the coupling points of these couplings. The outputs of the amplifiers 13 are supplied to the variable capacitors 12 to control the capacitance of the variable capacitors 12. With this arrangement, the propagation speed of a data signal propagating through the signal transmission line 10 is changed in response to the signal level of the clock signal propagating through the signal transmission line 11.

In so doing, adjustment may be made such that the propagation speed of the data signal propagating through the signal transmission line 10 is set to a first speed if the signal level of the clock signal is HIGH, and such that propagation speed of the data signal propagating through the signal transmission line 10 is set to a second speed if the signal level of the clock signal is LOW. If the first speed is faster than the second speed, a data signal situated in the rear of a rising edge of the clock signal in the propagation direction (i.e., on the left-hand side of the rising edge in FIG. 1) travels faster than a data signal situated in front of the rising edge of the clock signal in the propagation direction (i.e., on the right-hand side of the rising edge in FIG. 1). Accordingly, as the data signal propagates through the signal transmission line 10, the point of signal level transition of the data signal gradually moves relative to the clock signal such that the transition point is aligned with the rising edge of the clock signal. That is, after propagation through the signal transmission line 10 for a sufficiently long distance, the point of signal level transition of the data signal is aligned with the rising edge of the clock signal.

Conversely, if the second speed is faster than the first speed, a data signal situated in the rear of a falling edge of the clock signal in the propagation direction (i.e., on the left-hand side of the rising edge in FIG. 1) travels faster than a data signal situated in front of the falling edge of the clock signal in the propagation direction (i.e., on the right-hand side of the rising edge in FIG. 1). Accordingly, as the data signal propagates through the signal transmission line 10, the point of signal level transition of the data signal gradually moves relative to the clock signal such that the transition point is aligned with the falling edge of the clock signal. That is, after propagation through the signal transmission line 10 for a sufficiently long distance, the point of signal level transition of the data signal is aligned with the falling edge of the clock signal.

In the operations described above, the propagation speed of the data signal propagating through the signal transmission line 10 is adjusted such that the point of signal level transition of the data signal propagates at substantially the same speed as the clock signal in such manner as to follow an edge of the clock signal propagating through the signal transmission line 11. There may be a case, however, in which the signal propagation characteristics of the signal transmission line 10 significantly differ from the signal propagation characteristics of the signal transmission line 11. In such a case, there is a risk of failing to make the data signal propagate at desired speed through the adjustment of capacitance of the variable capacitors 12 because the desired speed falls outside the adjustable range. Accordingly, it is preferable that the signal propagation speed of the signal transmission line 10 is substantially equal to the signal propagation speed of the signal transmission line 11 when the capacitance of the variable capacitors 12 is set to a capacitance C1 situated substantially at the center of the adjustable range.

To this end, the signal lines are provided such that the characteristics of signal propagation on the signal transmission line 10 are the same as the characteristics of signal propagation on the signal transmission line 11, and, further, a dummy potential V2 is set such that the capacitance of the variable capacitors 16 becomes equal to the above-noted capacitance C1, with a dummy potential V1 also set such that the load of the amplifiers 15 as viewed from the input side thereof becomes equal to the load of the amplifiers 13 as viewed from the input side thereof. With such provision, the capacitance of the capacitors and the load of the amplifiers coupled to the signal transmission line 10 become substantially the same as the capacitance of the capacitors and the load of the amplifiers coupled to the signal transmission line 11 when the capacitance of the variable capacitors 12 is set to C1. Accordingly, the signal propagation speed of the signal transmission line 10 becomes substantially the same as the signal propagation speed of the signal transmission line 11 when the capacitance of the variable capacitors 12 is set to the capacitance C1.

Figure 2:
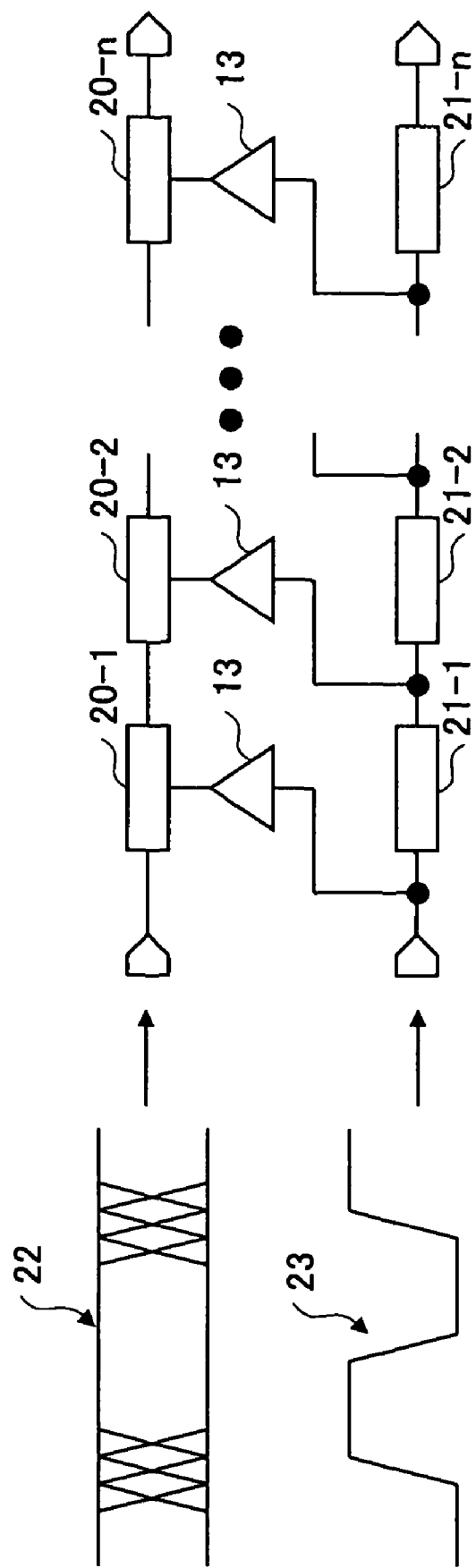
FIG. 2 is a drawing for further explaining the principle of the embodiment of FIG. 1.

FIG. 2 is a drawing for further explaining the principle of the embodiment. A plurality of delay lines 20-1 through 20-$n$ shown in FIG. 2 are provided for the purpose of allowing a data signal to propagate therethrough while adjusting its delay (propagation speed), and corresponds to the signal transmission line 10 and variable capacitors 12 shown in FIG. 1. One of the delay lines 20-1 through 20-$n$ corresponds to one variable capacitor 12 and a section of the signal transmission line 10 to which this variable capacitor 12 is coupled. A plurality of delay lines 21-1 through 21-$n$ shown in FIG. 2 are provided for the purpose of allowing a clock signal to propagate therethrough with a predetermined delay (propagation speed), and corresponds to the signal transmission line 11 shown in FIG. 1. One of the delay lines 21-1 through 21-$n$ corresponds to one variable capacitor 16 and a section of the signal transmission line 11 to which this variable capacitor 16 is coupled. Although the delay lines 20-1 through 20-$n$ are coupled in series to form one line in FIG. 2, provision may alternatively be made such that the delay lines 20-1 through 20-$n$ couple in parallel to each other between a signal line for the propagation of a data signal and another signal line, as will later be described in connection with subsequent embodiments. The delay lines 21-1 through 21-$n$ are coupled in series to form one line, and the clock signal is made to propagate through the delay lines 21-1 through 21-$n$ one by one.

According to the embodiment, a signal line having a plurality of sections (delay lines 21-1 through 21-$n$) for the propagation of a clock signal and the plurality of delay lines 20-1 through 20-$n$ for the propagation of a data signal disposed in one-to-one correspondence to the sections of the signal line are provided. The delay (propagation speed) of the data signal through a given one of the delay lines is set to a first delay (first propagation speed) if the level of the clock signal is at a first level in the corresponding one of the sections (at a single point in this section to be exact), and is set to a second delay (second propagation speed) if the level of the clock signal is at a second level in the corresponding one of the sections (at a single point in this section to be exact). For example, provision may be made such that the delay (propagation speed) is set to the first delay (first propagation speed) if the level of the clock signal is higher than a predetermined reference potential, and is set to the second delay (second propagation speed) if the level of the clock signal is lower than the predetermined reference potential.

The control of the delay of the delay lines (i.e., the control of propagation speed) is not limited to the capacitance-based delay control. For example, the delay control may be achieved by changing the inductance of inductors. Alternatively, the delay control may be achieved by changing the resistance on a path that supplies an electric current to capacitors. Namely, provision may be made such that the delay control is achieved by changing an electrical property (capacitance, inductance, resistance, or the like) of a passive device such as a capacitor, an inductor, and a resistor. Alternatively, provision may be made such that the delay control is achieved by using an active device such as an amplifier as a delay device instead of using a passive device.

In FIG. 2, a data signal 22 is input into the delay lines 20-1 through 20-$n$, and a clock signal 23 is input into the delay lines 21-1 through 21-$n$. In the illustrated example, the data signal 22 is generated such that its signal level changes at a rising edge of the clock signal 23. The data signal 22 ends up having jitter as the timing of signal level transition of the data signal 22 deviates from the timing of a rising edge of the clock signal 23 due to various reasons.

Figure 3:
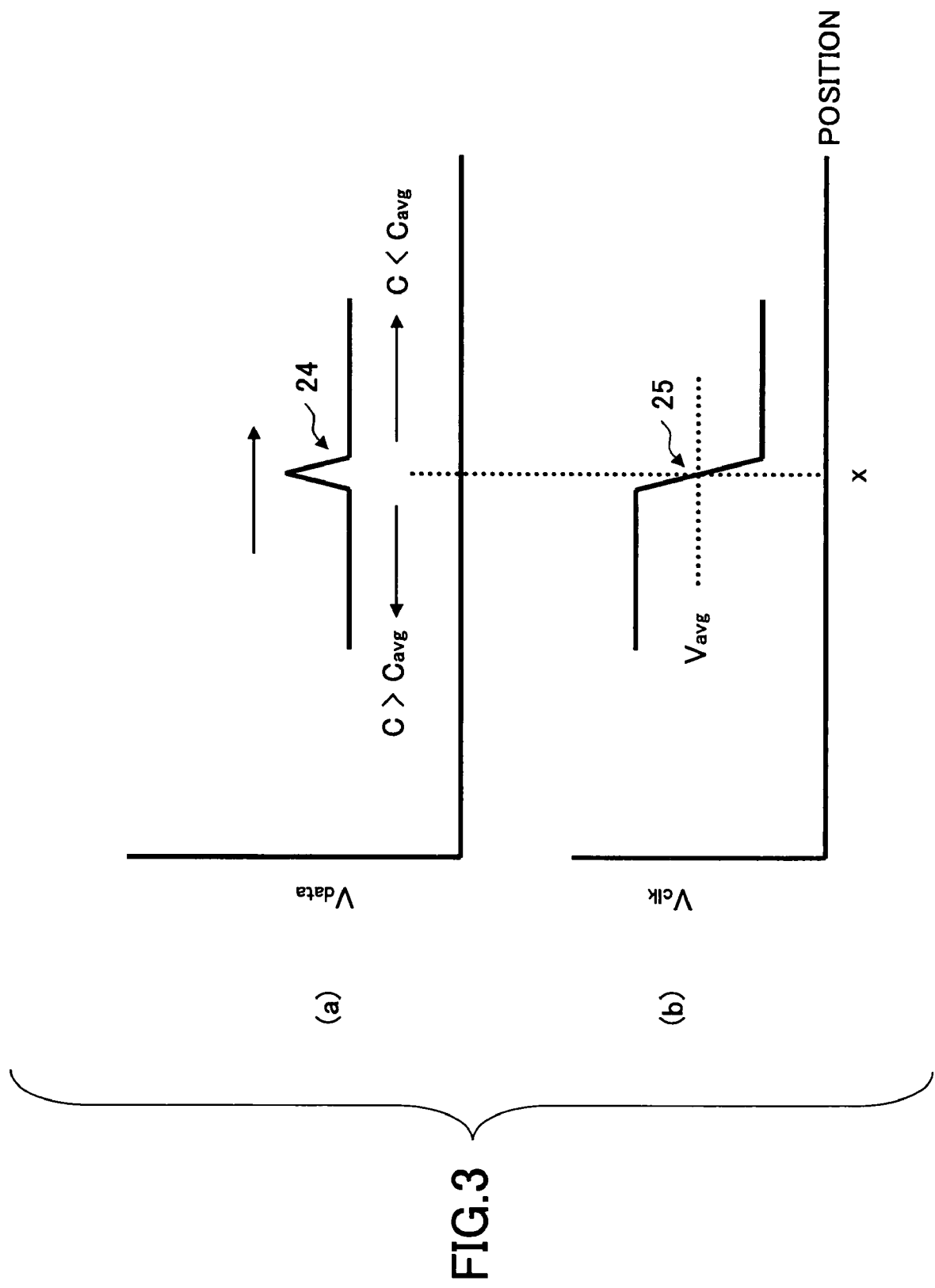
FIG. 3 is a drawing for explaining the relationship between a data signal propagating through delay lines and a clock signal.

FIG. 3 is a drawing for explaining the relationship between the data signal 22 propagating through the delay lines 20-1 through 20-$n$ and the clock signal 23 propagating the delay lines 21-1 through 21-$n$. A letter designation (a) illustrates an impulse signal 24 as one of the signal elements constituting the data signal 22, and a letter designation (b) illustrates a rising edge 25 of the clock signal 23. In FIG. 3, a horizontal axis indicates a position on a corresponding delay line, and a vertical axis shows a data signal voltage Vdata or clock signal voltage Vclk.

Attention is focused on a certain instance during a period in which the rising edge 25 of the clock signal 23 propagates through the delay lines 21-1 through 21-$n$. As shown in FIG. 3-($b$), the signal level is HIGH in the rear of a position x in the propagation direction (i.e., on the left-hand side of the position x in the figure), and is LOW in front of the position x in the propagation direction (i.e., on the right-hand side of the position x in the figure). In a corresponding manner, a signal propagation speed C is faster than a reference speed (average speed) Cavg in the rear of a position corresponding to the position x in the propagation direction (i.e., on the left-hand side of this position in the figure), and is slower than the reference speed (average speed) Cavg in front of this position in the propagation direction (i.e., on the right-hand side of this position in the figure). The reference speed (average speed) Cavg is the signal propagation speed of the data signal 22 that is achieved when the capacitance of the variable capacitors 12 is set to the capacitance C1 substantially at the center of its adjustable range as was described in connection with FIG. 1. In other words, Cavg is the signal propagation speed of the data signal 22 that is achieved when the signal level of the clock signal 23 is equal to a midpoint potential (average potential) Vavg between HIGH and LOW. In other words, further, Cavg is the propagation speed that is expected of the clock signal 23.

With the signal propagation speed being set as described above, the impulse signal 24 of the data signal 22 propagates with high speed so as to catch up with the rising edge 25 if the impulse signal 24 is traveling behind the rising edge 25, and propagates with slow speed to let the rising edge 25 catch up if the impulse signal 24 is traveling ahead of the rising edge 25. In the steady state, thus, the impulse signal 24 travels substantially at the same speed as the rising edge 25 such as not to be separated from the rising edge 25.

Figure 4:
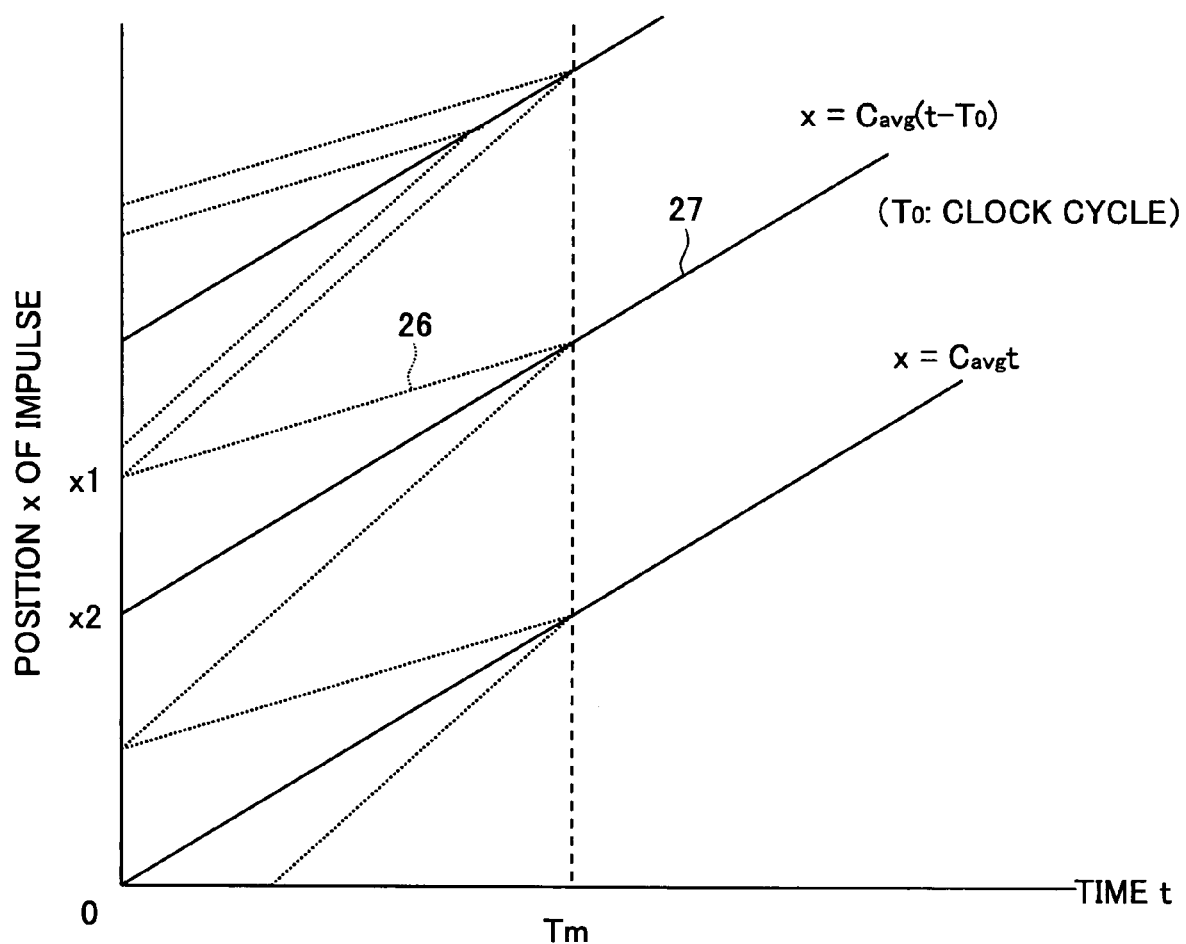
FIG. 4 is a drawing showing the way the position of each impulse signal constituting a data signal converges on a rising edge of a clock signal.

FIG. 4 is a drawing showing the way the position of each impulse signal constituting a data signal converges on a rising edge of a clock signal. In FIG. 4, the horizontal axis represents time t, and the vertical axis represents a position x of an impulse signal on the delay lines 20-1 through 20-$n$ (and the corresponding position of a rising edge on the delay lines 21-1 through 21-$n$).

In FIG. 4, each single dotted line corresponds to one impulse signal of the data signal 22, and represents the change of position of this impulse signal. Further, each single solid line corresponds to one rising edge of the clock signal 23, and represents the change of position of this rising edge. FIG. 4 shows a plurality of solid lines representing respective rising edges, which correspond to respective cycles of the clock signal 23.

The impulse signal corresponding to a dotted line 26, for example, is situated at position x1 at time 0. The rising edge corresponding to a solid line 27 is situated at position x2 at time 0. As time passes, the impulse signal corresponding to the dotted line 26 propagates through the delay lines 20-1 through 20-$n$ so that the position x increases. The propagation speed of this impulse signal is represented by the slope of the dotted line 26. By the same token, as time passes, the rising edge corresponding to the solid line 27 propagates through the delay lines 21-1 through 21-$n$ so that the position x increases. The propagation speed of this rising edge is represented by the slope of the solid line 27.

The impulse signal corresponding to the dotted line 26 is situated ahead of the rising edge corresponding to the solid line 27, so that this impulse signal travels with speed slower than the reference speed Cavg shown in FIG. 3. The rising edge corresponding to the solid line 27 travels with speed equal to the reference speed Cavg. After the passage of a sufficiently long time, thus, the rising edge corresponding to the solid line 27 catches up with the impulse signal corresponding to the dotted line 26, and, thereafter, they travel side by side substantially at the same speed. With one cycle of the clock signal 23 being denoted as T0, a time Tm required for all the impulse signals of the data signal 22 converge on the rising edges of the clock signal 23 is derived as CavgT0/(Cmax−Cmin).

Figure 5:
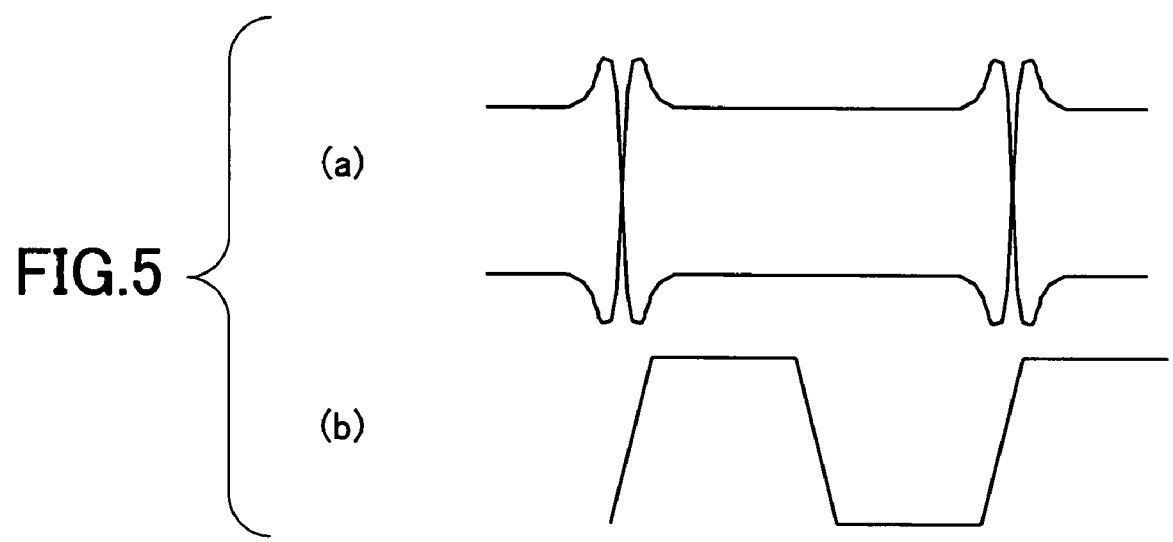
FIG. 5 is a drawing for explaining a signal overshoot and a signal undershoot.

As was described by referring to FIGS. 2 through 4, the propagation speed of each impulse signal constituting the data signal 22 is adjusted such that each impulse signal converges on the position (timing) corresponding to a rising edge of the clock signal 23. In this case, the energy of the data signal 22 converges on the position (timing) corresponding to a rising edge of the clock signal 23, which may cause a signal overshoot or undershoot. FIG. 5 is a drawing for explaining a signal overshoot and a signal undershoot.

In FIG. 5, a letter designation (a) illustrates the waveform of the data signal 22 after propagating through the delay lines 20-1 through 20-$n$, and a letter designation (b) illustrates the waveform of the corresponding clock signal 23. When the data signal 22 propagates through the delay lines 20-1 through 20-$n$, each impulse signal constituting the data signal 22 converges on a rising edge of the clock signal 23 as was described above. As a result, as shown in FIG. 5-(a), the data signal 22 having propagated through the delay lines 20-1 through 20-$n$ has its signal amplitude larger than usual at the positions corresponding to the rising edges of the clock signal 23. Namely, a signal overshoot or undershoot occurs. In order to remove such signal overshoot and undershoot, a nonlinear amplifier (i.e., comparator) may be used to restore proper waveform.

Figure 6:
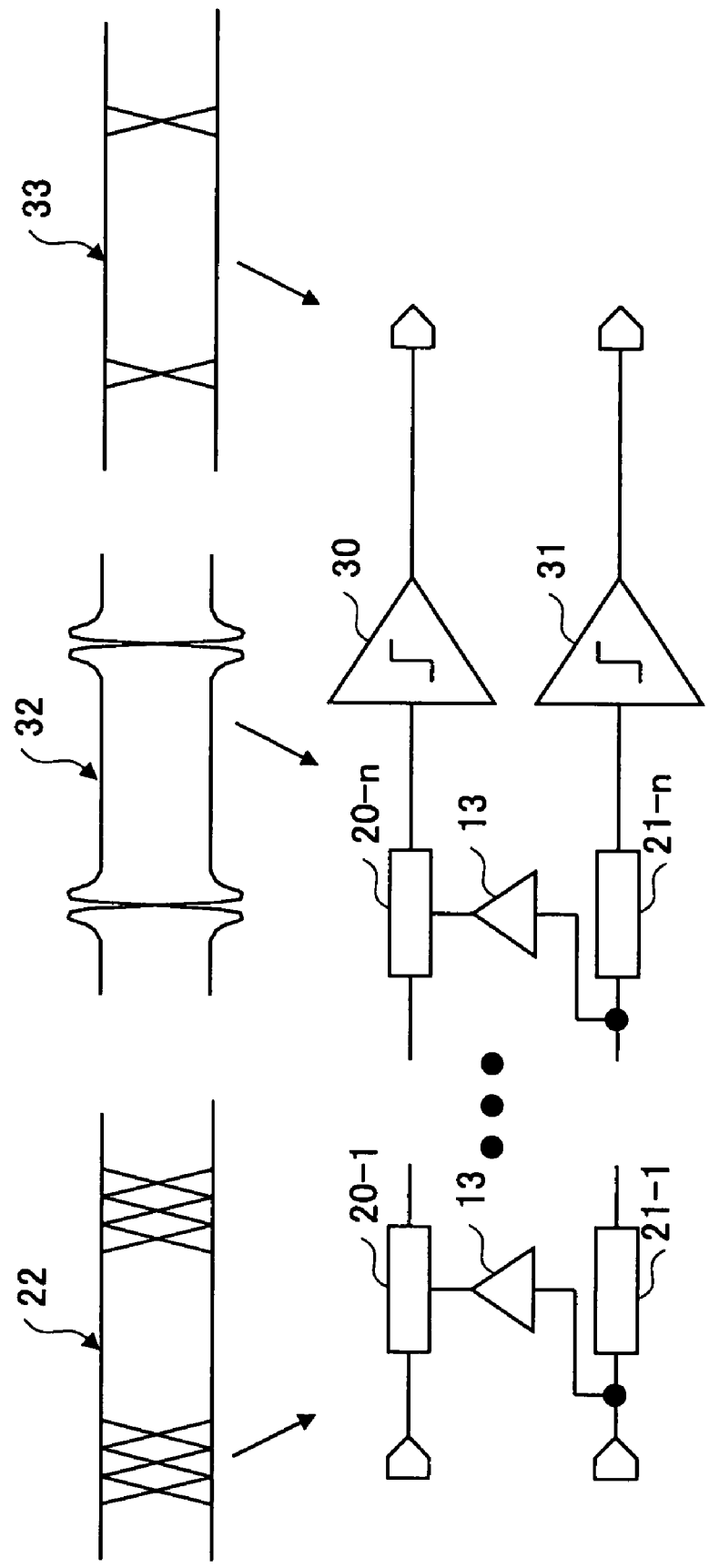
FIG. 6 is a drawing showing a configuration for restoring waveform by use of nonlinear amplifiers.

FIG. 6 is a drawing showing a configuration for restoring waveform by use of nonlinear amplifiers. In FIG. 6, the same elements as those of FIG. 2 are referred to by the same numerals, and a description thereof will be omitted. The jitter reduction circuit shown in FIG. 6 is configured such that a comparator 30 is coupled to the output of the delay lines 20-1 through 20-$n$, and such that a comparator 31 is coupled to the output of the delay lines 21-1 through 21-$n$. As the data signal 22 propagates through the delay lines 20-1 through 20-$n$, the data signal ends up having a waveform inclusive of overshoot and undershoot as shown as a data signal 32.

The comparator 30 receives the data signal 32 inclusive of overshoot and undershoot for comparison with a predetermined reference voltage. The comparator 30 outputs a HIGH signal if the potential level of the data signal 32 is higher than the reference voltage, and outputs a LOW signal if the potential level of the data signal 32 is lower than the reference voltage. As a result, the output signal of the comparator 30 is a reshaped data signal 33 made by removing the overshoot and undershoot from the data signal 32. The comparator 31 is provided for the purpose of reshaping the clock signal in a similar manner. This makes it possible to restore the waveform of the clock signal and to align the reshaped data signal 33 with the clock signal in terms of their timing. The nonlinear amplifiers described above also offer an advantage in that the amplitude of a signal attenuated by passive devices is restored when the passive devices are used to control the propagation speed (delay) of the signal.

Figure 7:
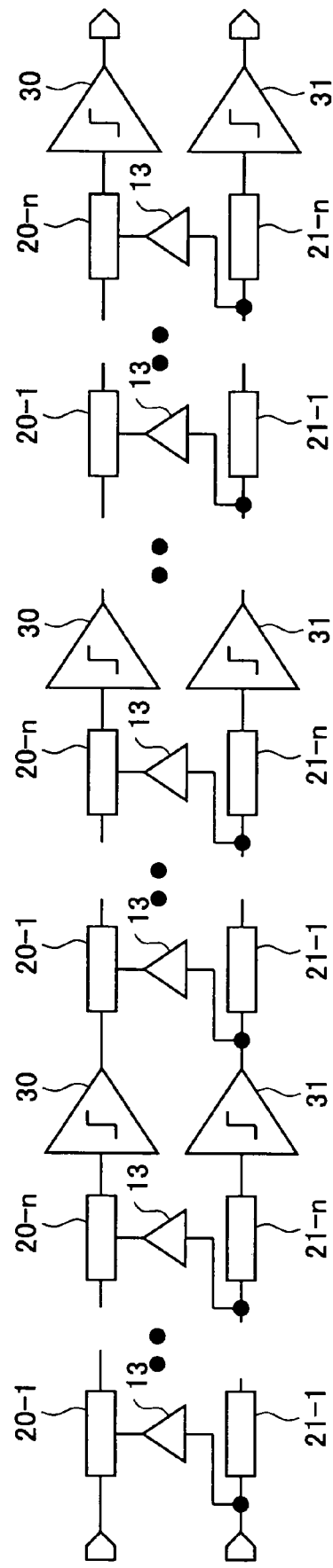
FIG. 7 is a drawing showing a configuration in which jitter reduction circuits provided with a waveform reshaping function are coupled in series.

FIG. 7 is a drawing showing a configuration in which the jitter reduction circuits provided with the comparator-based reshaping function are coupled in series. As shown in FIG. 7, the jitter reduction circuits with the waveform reshaping function are coupled in series, so that the data signal and clock signal can travel a long distance without being affected by signal distortion, overshoot, and undershoot.

In the following, embodiments will be described with reference to the accompanying drawings.

Figure 8:
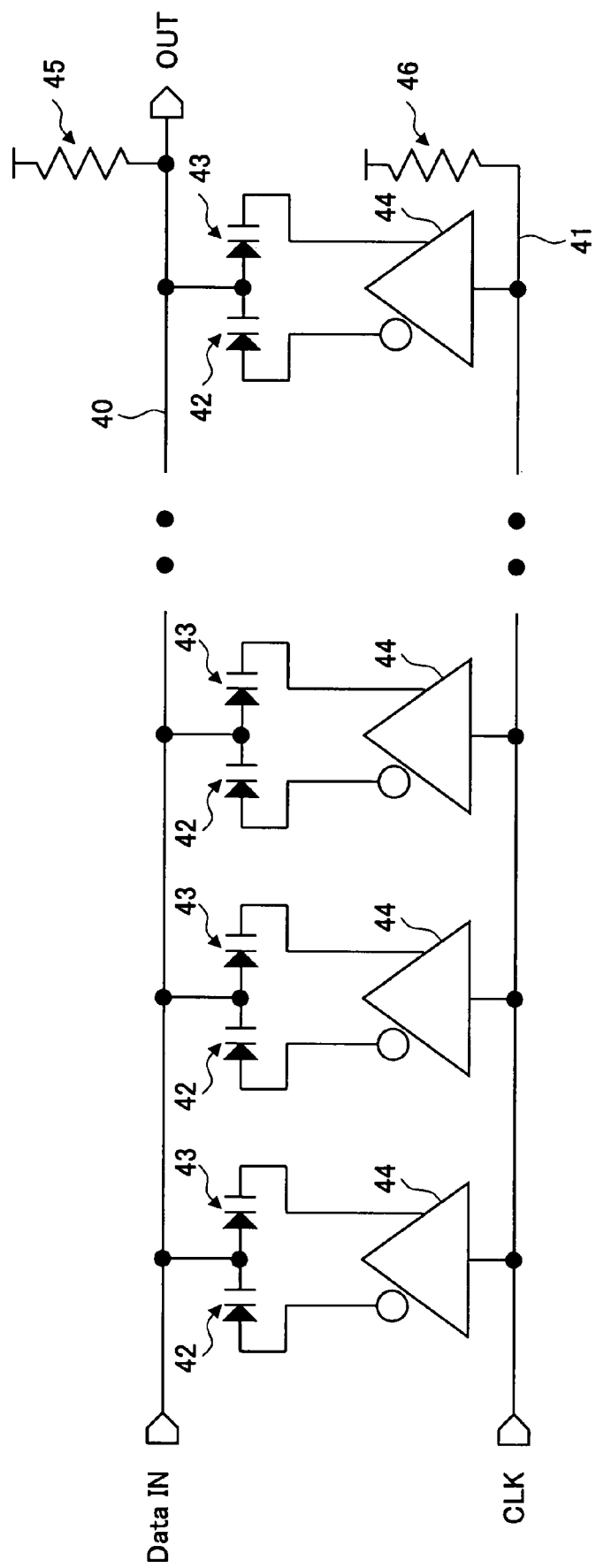
FIG. 8 is a drawing showing the configuration of another embodiment.

FIG. 8 is a drawing showing the configuration of another embodiment of a jitter reduction circuit according to the embodiment. The jitter reduction circuit shown in FIG. 8 includes a signal transmission line 40 serving as a delay line, a signal transmission line 41 serving as a delay line, a plurality of varactors (variable capacitance diodes) 42 and 43 that are devices for adjusting the delay of the signal transmission line 40, a plurality of amplifiers 44 for controlling varactors 42 and 43, and resistors 45 and 46.

A data signal propagates through the signal transmission line 40. The data signal represents information by the binary values "HIGH" and "LOW", and the signal level transition between HIGH and LOW is supposed to be in synchronization with a clock signal. Namely, a signal transmission end generates a data signal as a signal having the changes of signal level synchronized with a clock signal, and transmits the generated data signal to the signal transmission line 40. A signal receiving end receives the data signal through the signal transmission line 40, and may detect the received data signal in synchronization with the clock signal.

The clock signal propagates through the signal transmission line 41. The signal transmission line 40 and the signal transmission line 41 run parallel to each other. The propagation speed of a data signal propagating through the signal transmission line 40 changes in response to the signal level of a clock signal propagating through the signal transmission line 41. In the example shown in FIG. 8, the input ends of the amplifiers 44 are coupled to the signal transmission line 41, and the amplifiers 44 compare the signal levels of the clock signal observed at the coupling points of these couplings with a predetermined reference voltage. The amplifiers 44 sets its non-inverted output to a positive potential and its inverted output to a negative potential if the signal level of the clock signal is higher than the predetermined reference voltage (i.e., if it is HIGH). Further, the amplifiers 44 sets its non-inverted output and inverted output to a ground potential if the signal level of the clock signal is lower than the predetermined reference voltage (i.e., if it is LOW).

The varactors 42 and 43 are coupled in series, and the joint point between the varactors 42 and 43 is coupled to a corresponding position of the signal transmission line 40. The inverted output and non-inverted output of the amplifiers 44 are supplied to the series coupled variable capacitors 42 and 43 to control the capacitance of the varactors 42 and 43. With this arrangement, the propagation speed of a data signal propagating through the signal transmission line 40 is changed in response to the signal level of the clock signal propagating through the signal transmission line 41.

In so doing, adjustment may be made such that the propagation speed of the data signal propagating through the signal transmission line 10 is set to a first speed if the signal level of the clock signal is HIGH, and such that propagation speed of the data signal propagating through the signal transmission line 10 is set to a second speed if the signal level of the clock signal is LOW. If the first speed is faster than the second speed, a data signal situated in the rear of a rising edge of the clock signal in the propagation direction (i.e., on the left-hand side of the rising edge in FIG. 8) travels faster than a data signal situated in front of the rising edge of the clock signal in the propagation direction (i.e., on the right-hand side of the rising edge in FIG. 8). The varactors 42 and 43 have such characteristics that their capacitance decreases in response to an increase in a reverse bias voltage. Accordingly, the capacitance decreases when the clock signal is HIGH, and increases when the clock signal is LOW. The propagation speed thus increases when the clock signal is HIGH, and decreases when the clock signal is LOW.

Accordingly, as the data signal propagates through the signal transmission line 40, the point of signal level transition of the data signal gradually moves relative to the clock signal such that the transition point is aligned with the rising edge of the clock signal. That is, after propagation through the signal transmission line 40 for a sufficiently long distance, the point of signal level transition of the data signal is aligned with the rising edge of the clock signal.

Figure 9A:
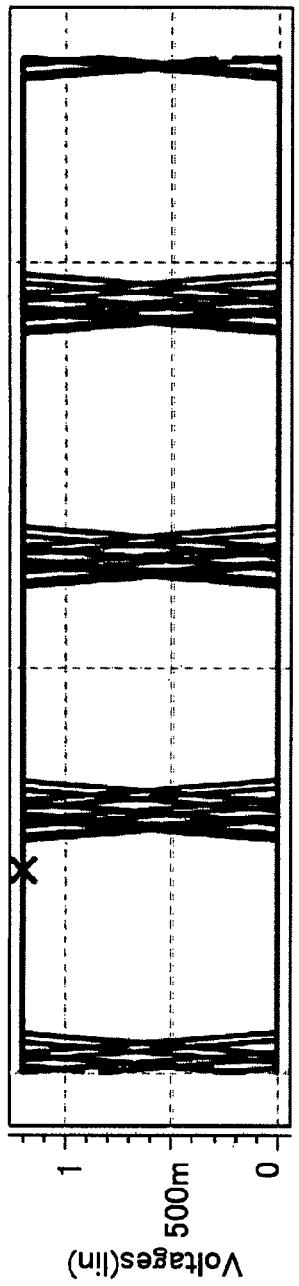
FIGS. 9A through 9C are drawings showing the results of computer simulation regarding circuit operation.
Figure 9B:
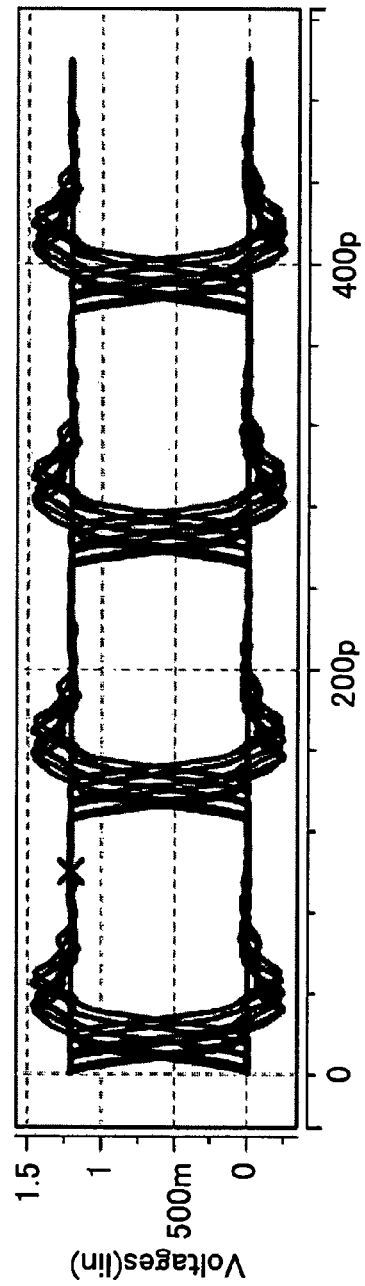
Figure 9C:
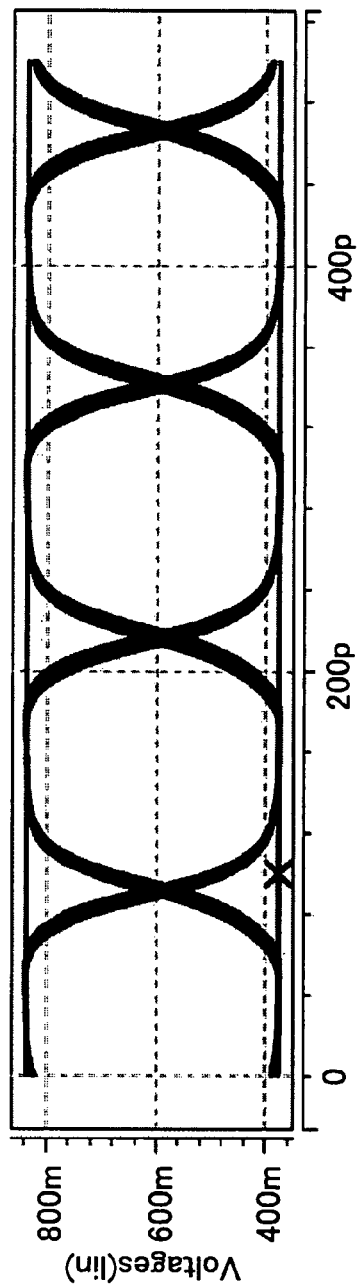

FIGS. 9A through 9C are drawings showing the results of computer simulation regarding circuit operation. In this computer simulation, an ideal capacitance model whose capacitance changes in an ideal fashion in response to an input voltage was used as the variable capacitors, and the simulation was conducted with respect to a 6-stage jitter reduction circuit (i.e., having 6 circuit stages, each of which is comprised of a pair of varactors 42 and 43 and an amplifier 44 as shown in FIG. 8).

FIG. 9A illustrates the waveform of a signal at the signal source. This waveform is directed to a single data signal having "0"s and "1"s appearing in a random manner, and is made by superimposing this data signal on itself multiple times for a period of several cycles. This data signal includes jitter, so that the timing of 0/1-signal-level transition is not aligned with a predetermined timing (i.e., the timing synchronized with a clock signal). Because of this, the multiple superimposition of the data signal for the period of several cycles results in the signal waveforms with timing fluctuation being superimposed on one another, so that multiple trace lines appear at the positions of signal level transition as shown in FIG. 9A.

FIG. 9B shows a signal waveform that appears at the input end when the signal shown in FIG. 9A is input into the signal transmission line 40. The waveform is distorted due to the effect of capacitance and inductance at the joint of the input end, resulting in the signal having a signal distortion in addition to the jitter.

FIG. 9C illustrates an output signal waveform that appears at an output node OUT of the signal transmission line 40 shown in FIG. 8. As illustrated, the jitter and waveform distortion of the signal are reduced, thereby presenting an extremely desirable data waveform. The jitter of the signal at the signal source shown in FIG. 9A has a fluctuation in the range of 20 ps (picoseconds). In the output waveform shown in FIG. 9C, a jitter corresponding to a fluctuation of 13.5 ps (picoseconds) has been removed from the 20-ps fluctuation contained at the signal source.

Figure 10A:
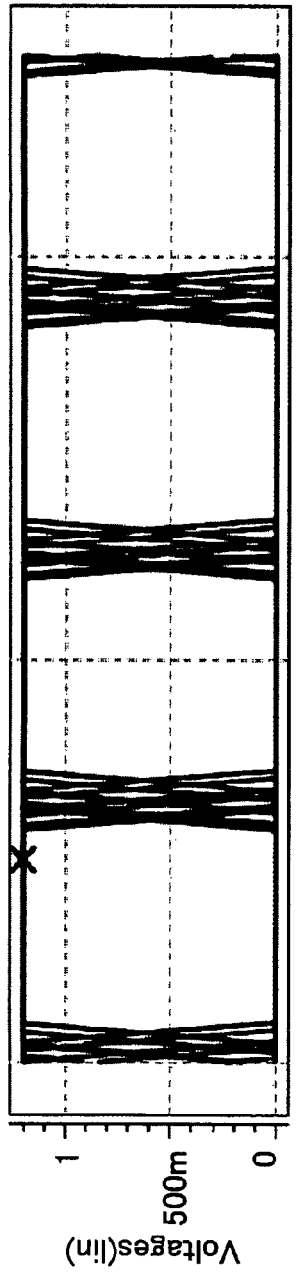
FIGS. 10A through 10C are drawings showing other results of computer simulation regarding circuit operation.
Figure 10B:
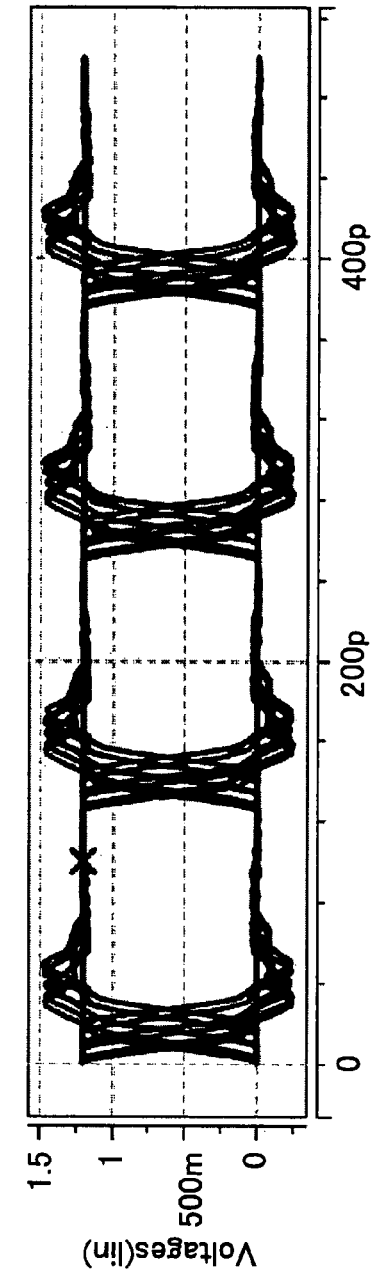
Figure 10C:
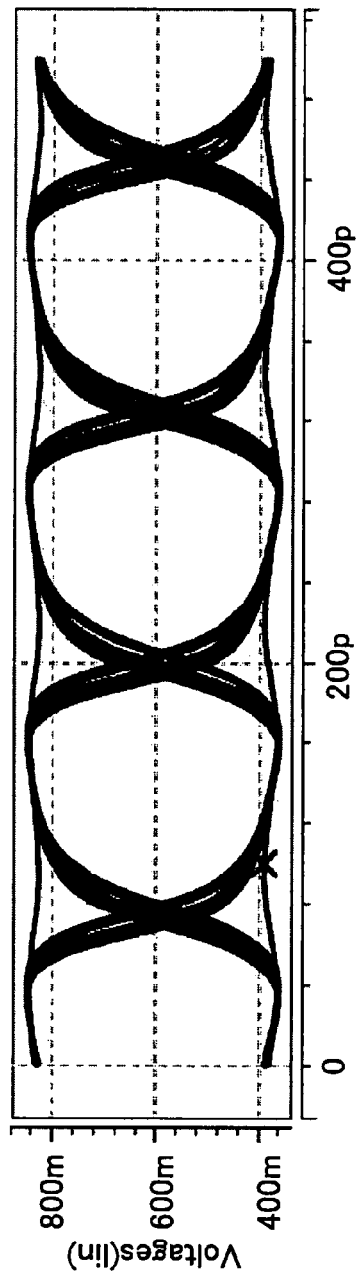

FIGS. 10A through 10C are drawings showing other results of computer simulation regarding circuit operation. In the simulation shown in FIGS. 10A through 10C, a varactor model is used as the variable capacitors, and simulation is conducted with respect to a 6-stage jitter reduction circuit. The signal waveforms shown in FIGS. 10A through 10C are a waveform at the signal source, a waveform at the transmission line input end, and an output waveform as in the case of FIGS. 9A through 9C. As can be seen from FIG. 10C, the output waveform is a satisfactory data waveform despite the fact that small jitter and waveform distortion still remain. The jitter of the signal at the signal source shown in FIG. 10A has a fluctuation in the range of 20 ps (picoseconds). In the output waveform shown in FIG. 10C, a jitter corresponding to a fluctuation of 7.2 ps (picoseconds) has been removed from the 20-ps fluctuation contained at the signal source.

Figure 11:
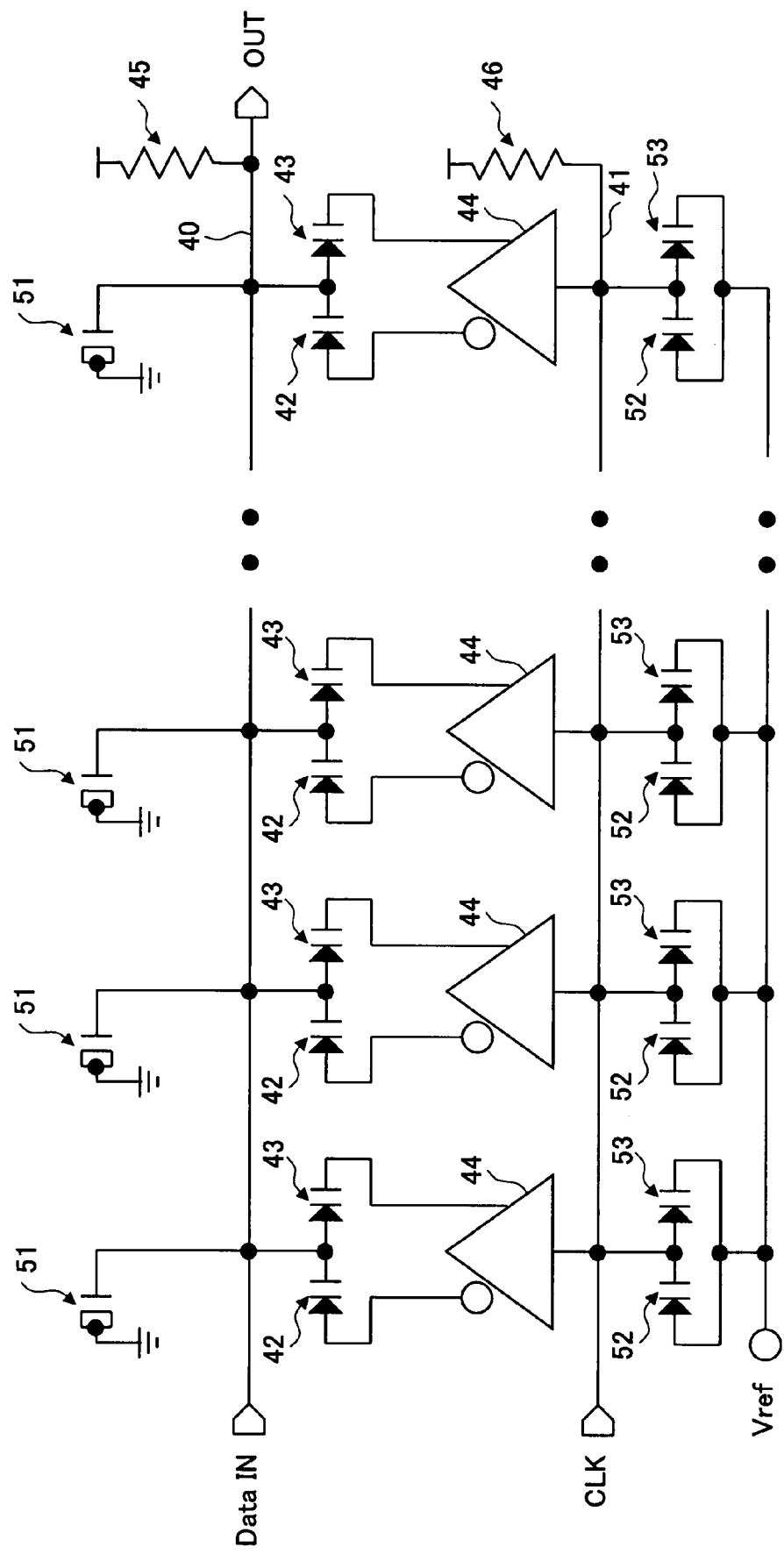
FIG. 11 is a drawing showing the configuration of another embodiment.

FIG. 11 is a drawing showing the configuration of another embodiment of the jitter reduction circuit according to the embodiment. In FIG. 11, the same elements as those of FIG. 8 are referred to by the same numerals, and a description thereof will be omitted.

The jitter reduction circuit of FIG. 11 includes a plurality of capacitor devices 51 provided for the signal transmission line 40 and a plurality of varactors 52 and 53 provided for the signal transmission line 41, in addition to the signal transmission line 40, the signal transmission line 41, the varactors 42 and 43, the amplifiers 44, and the resistors 45 and 46 shown in FIG. 8.

As was described with respect to the operation of the circuit of FIG. 1, it is preferable in a configuration as shown in FIG. 11 that the signal propagation speed of the signal transmission line 40 is substantially equal to the signal propagation speed of the signal transmission line 41 when the capacitance of the varactors 42 and 43 is set to a capacitance situated substantially at the center of the adjustable range. To this end, the signal lines are provided such that the characteristics of signal propagation on the signal transmission line 40 are the same as the characteristics of signal propagation on the signal transmission line 41, and, further, a reference potential Vref is set such that the capacitance of the varactors 52 and 53 becomes equal to the above-noted capacitance situated substantially at the center, with the load of the capacitor devices 51 being set substantially equal to the load of the amplifiers 44 as viewed from the input side thereof. With such settings, the signal propagation speed of the signal transmission line 40 becomes substantially the same as the signal propagation speed of the signal transmission line 41 when the capacitance of the varactors 42 and 43 is set around at the center of the adjustable range.

Figure 12:
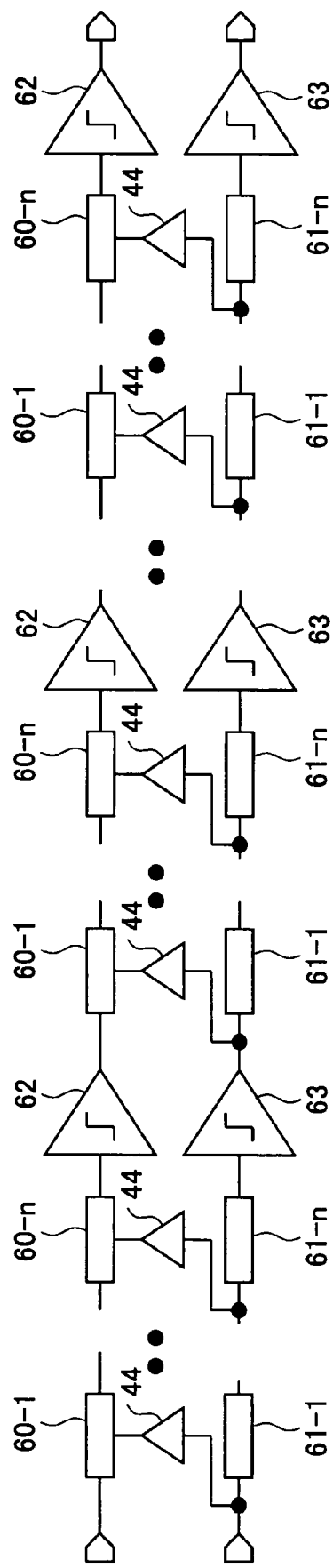
FIG. 12 is a drawing showing the configuration of another embodiment.

FIG. 12 is a drawing showing the configuration of another embodiment of the jitter reduction circuit according to the embodiment. In FIG. 12, the same elements as those of FIG. 8 are referred to by the same numerals, and a description thereof will be omitted.

A plurality of delay lines 60-1 through 60-n shown in FIG. 12 are provided for the purpose of allowing a data signal to propagate therethrough while adjusting its delay (propagation speed), and corresponds to the signal transmission line 40 and varactors 42 and 43 shown in FIG. 8. One of the delay lines 60-1 through 60-n corresponds to one pair of varactors 42 and 43 and a section of the signal transmission line 40 to which this pair is coupled. A plurality of delay lines 61-1 through 61-n shown in FIG. 12 are provided for the purpose of allowing a clock signal to propagate therethrough with a predetermined delay (propagation speed), and corresponds to the signal transmission line 41 shown in FIG. 8. Namely, each of the delay lines 61-1 through 61-n corresponds to a section of the signal transmission line 41.

The jitter reduction circuit shown in FIG. 12 is configured such that a comparator 62 is coupled to the output of the delay lines 60-1 through 60-n, and such that a comparator 63 is coupled to the output of the delay lines 61-1 through 61-n. As a data signal propagates through the delay lines 60-1 through 60-n, the data signal ends up having a waveform inclusive of overshoot and undershoot.

The comparator 62 receives the data signal inclusive of overshoot and undershoot for comparison with a predetermined reference voltage. The comparator 62 outputs a HIGH signal if the potential level of the data signal is higher than the reference voltage, and outputs a LOW signal if the potential level of the data signal is lower than the reference voltage. As a result, the output signal of the comparator 62 is a reshaped data signal made by removing the overshoot and undershoot from the input data signal. The comparator 63 is provided for the purpose of reshaping the clock signal in a similar manner. This makes it possible to restore the waveform of the clock signal and to align the data signal with the clock signal in terms of their timing.

In the jitter reduction circuit shown in FIG. 12, further, the jitter reduction circuits provided with the comparator-based reshaping function are coupled in series. As shown in FIG. 12, the jitter reduction circuits with the waveform reshaping function are coupled in series, so that the data signal and clock signal can travel a long distance without being affected by signal distortion, overshoot, and undershoot.

Figure 13:
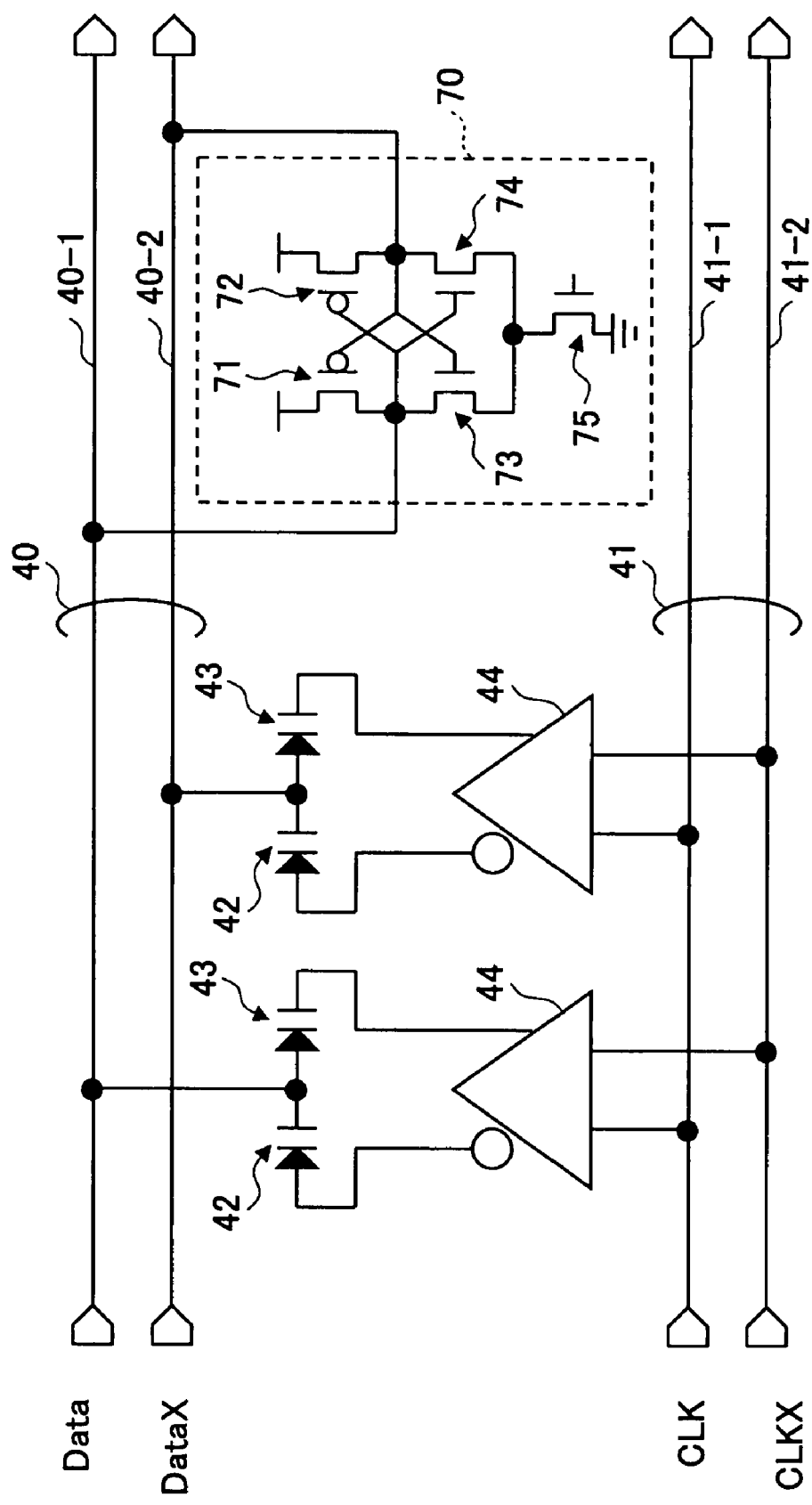
FIG. 13 is a drawing showing the configuration of another embodiment.

FIG. 13 is a drawing showing the configuration of another embodiment of the jitter reduction circuit according to the embodiment. In FIG. 13, the same elements as those of FIG. 8 are referred to by the same numerals, and a description thereof will be omitted.

The jitter reduction circuit of FIG. 13 includes a negative conductor 70 provided for the signal transmission line 40, in addition to the signal transmission line 40, the signal transmission line 41, the varactors 42 and 43, and the amplifiers 44 shown in FIG. 8. The negative conductor 70 includes PMOS transistors 71 and 72 and NMOS transistors 73 through 75.

In the configuration shown in FIG. 13, each of the data signal and the clock signal is provided as a pair of differential signals. The signal transmission line 40 for the propagation of a data signal includes a signal transmission line 40-1 for transmitting a positive polarity data signal Data and a signal transmission line 40-2 for transmitting a negative polarity data signal Datax. Further, the signal transmission line 41 for the propagation of a clock signal includes a signal transmission line 41-1 for transmitting a positive polarity clock signal CLK and a signal transmission line 41-2 for transmitting a negative polarity clock signal CLKX.

In this case, the amplifier 44 sets its non-inverted output to a positive potential and its inverted output to a negative potential if the signal level of the positive polarity clock signal CLK is higher than the signal level of the negative polarity clock signal CLKX (i.e., if the clock signal CLK is HIGH). Further, the amplifier 44 sets its non-inverted output and inverted output to a ground potential if the signal level of the positive polarity clock signal CLK is lower than the signal level of the negative polarity clock signal CLKX (i.e., if the clock signal CLK is LOW).

The negative conductor 70 serves to amplify a potential difference between the positive polarity data signal Data and the negative polarity data signal Dtatax. This can prevent the data signal from attenuating as it propagates through the signal transmission line 40. With this arrangement, the capacitance of the negative conductor is incorporated in the capacitance of the transmission line par unit length, so that the high-frequency characteristics are not limited by the parasitic capacitance of the negative conductor, thereby achieving a broadband circuit.

Figure 14:
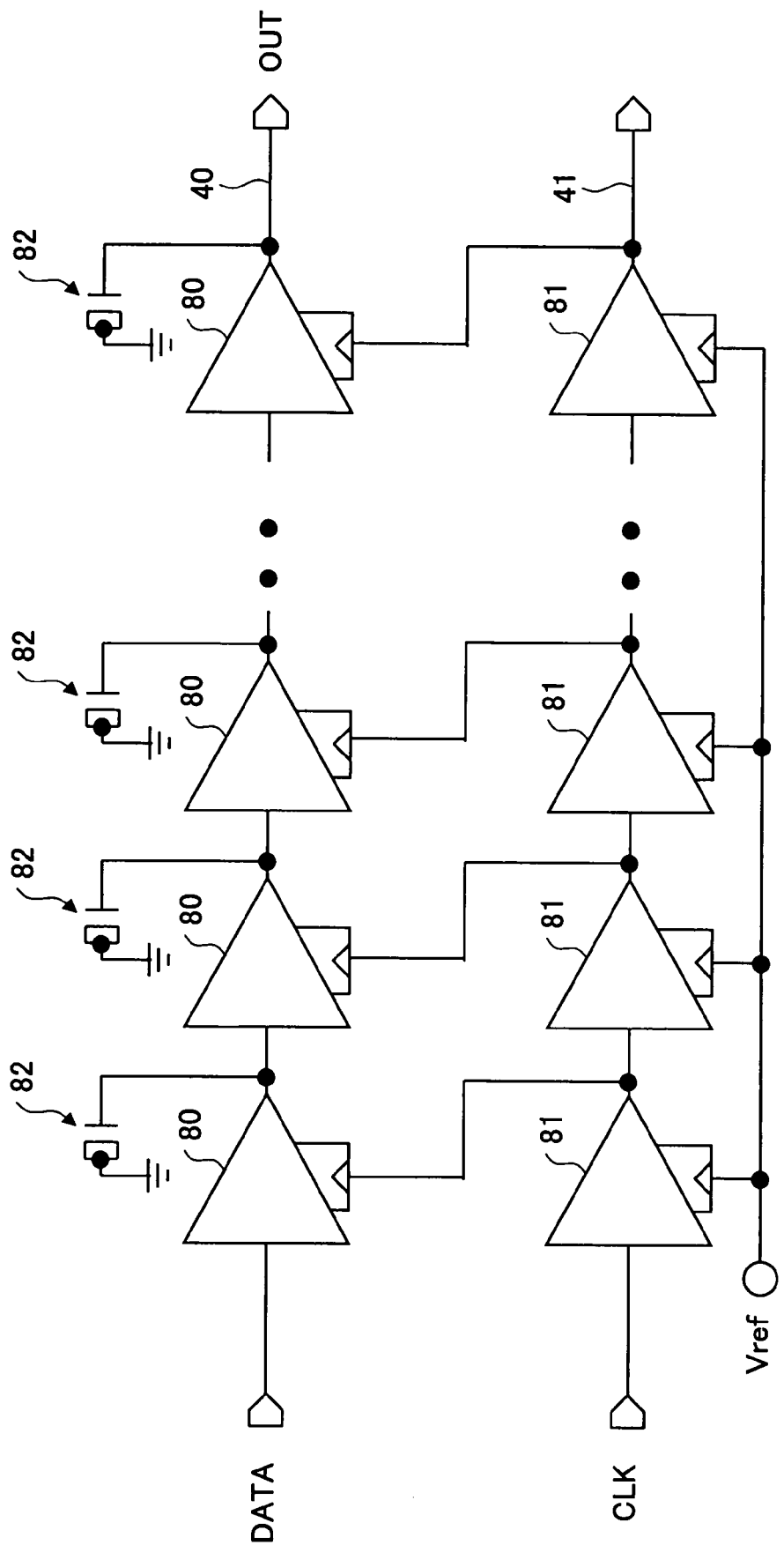
FIG. 14 is a drawing showing the configuration of another embodiment.

FIG. 14 is a drawing showing the configuration of another embodiment of the jitter reduction circuit according to the embodiment. In FIG. 14, the same elements as those of FIG. 8 are referred to by the same numerals, and a description thereof will be omitted.

The jitter reduction circuit of FIG. 14 includes the signal transmission line 40, the signal transmission line 41, a plurality of delay elements 80 inserted into the signal transmission line 40, a plurality of delay elements 81 inserted into the signal transmission line 41, and a plurality of capacitor devices 82 coupled to the signal transmission line 40. In the configuration shown in FIG. 8, the capacitance of the capacitors coupled to the signal transmission line 40 is controlled to adjust the propagation speed of the data signal propagating through the signal transmission line 40. In the configuration shown in FIG. 14, on the other hand, the delay elements 80 are inserted into the signal transmission line 40, and are controlled in response to the signal level of a clock signal propagating through the signal transmission line 41, thereby adjusting the delay time (propagation speed) of the data signal propagating through the signal transmission line 40.

Figure 15:
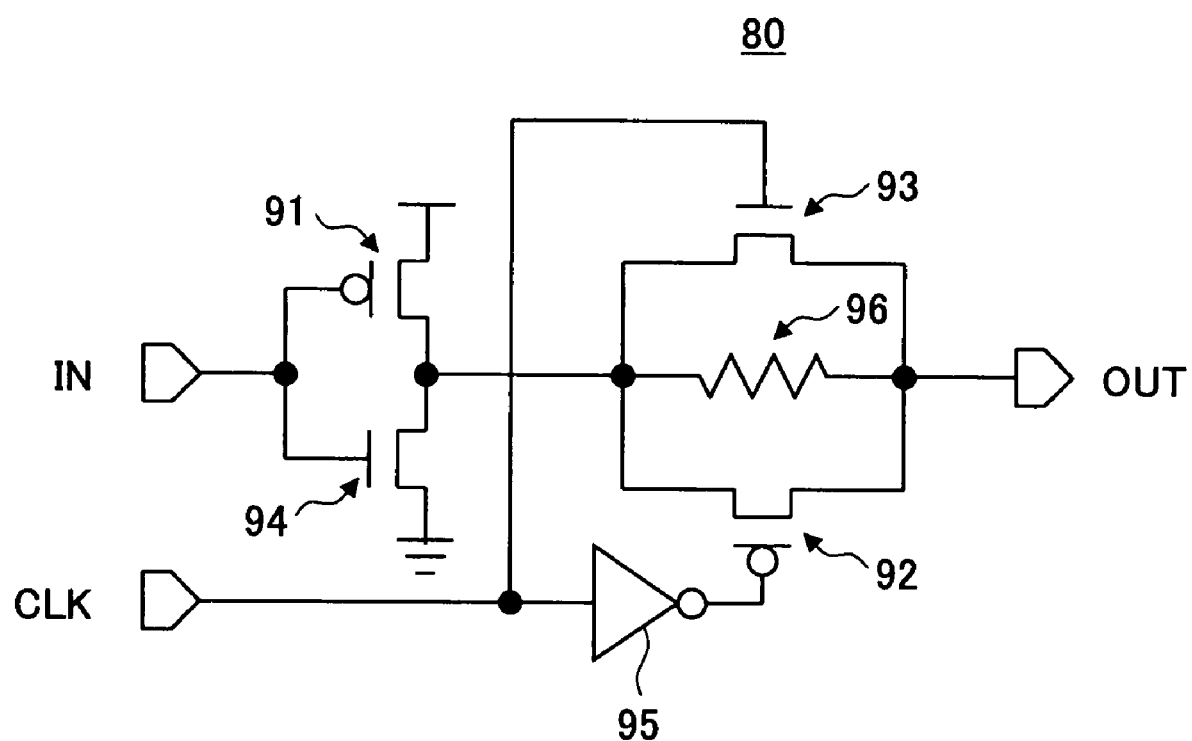
FIG. 15 is a drawing showing an example of the configuration of a delay element of FIG. 14.

FIG. 15 is a drawing showing an example of the configuration of a delay element 80. The delay element 80 shown in FIG. 15 includes PMOS transistors 91 and 92, NMOS transistors 93 and 94, an inverter 95, and a resistor 96. The PMOS transistor 91 and the NMOS transistor 94 constitute an inverter. A data signal propagates through this inverter and the resistor 96. The inverter comprised of the PMOS transistor 91 and the NMOS transistor 94 serves as an amplifier to amplify a signal to restore the signal level.

The NMOS transistor 93 and the PMOS transistor 92 are coupled in parallel to the resistor 96, and become conductive in response to the HIGH state of the clock signal CLK to form a route bypassing the resistor 96. This decreases the resistance of the route supplying an electric current to a parasitic capacitance situated at an output node OUT, thereby increasing the charge speed of the parasitic capacitance, resulting in an increase in the signal propagation speed. Conversely, the NMOS transistor 93 and the PMOS transistor 92 become nonconductive when the clock signal CLK is LOW, so that no route bypassing the resistor 96 is formed. This increases the resistance of the route supplying an electric current to a parasitic capacitance situated at an output node OUT, thereby decreasing the charge speed of the parasitic capacitance, resulting in a drop in the signal propagation speed.

The delay elements 81 in FIG. 14 are provided for the purpose of giving the signal transmission line 41 the delay conditions equivalent to those of the signal transmission line 40. The configuration of the delay elements 81 is the same as that of the delay elements 80, and has the circuit configuration shown in FIG. 15. A voltage Vref that is a midpoint potential between HIGH and LOW of the clock signal CLK is supplied as a control signal to the delay elements 81. The capacitor devices 82 are configured such that the load of the capacitor devices 82 as viewed from the signal transmission line 40 becomes equal to the load of the delay elements 80 as viewed from the signal transmission line 41. With these settings, the propagation speed of the clock signal propagating through the signal transmission line 41 can be set approximately equal to an average of the propagation speed of the data signal propagating through the signal transmission line 40.

Figure 16A:
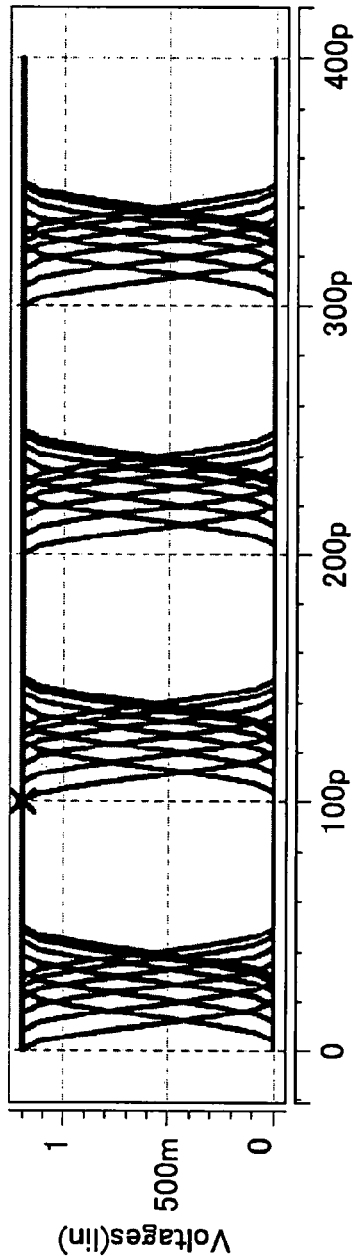
FIGS. 16A through 16C are drawings showing the results of computer simulation regarding circuit operation.
Figure 16B:
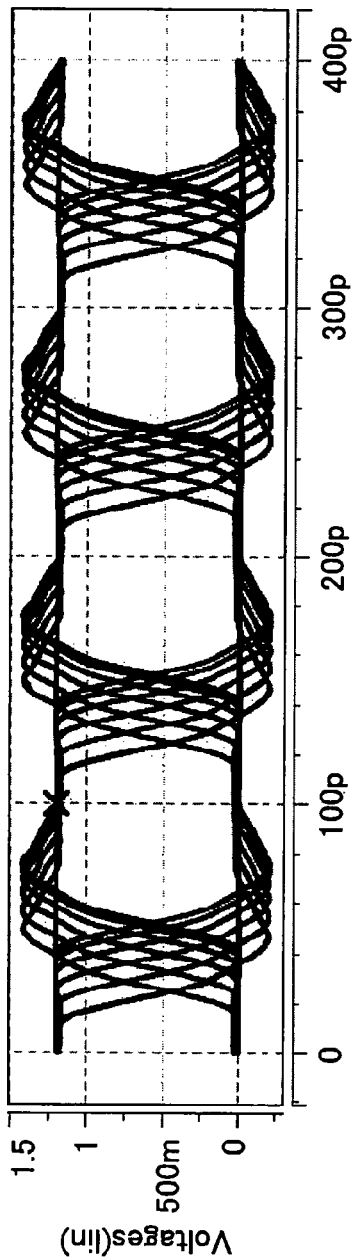
Figure 16C:
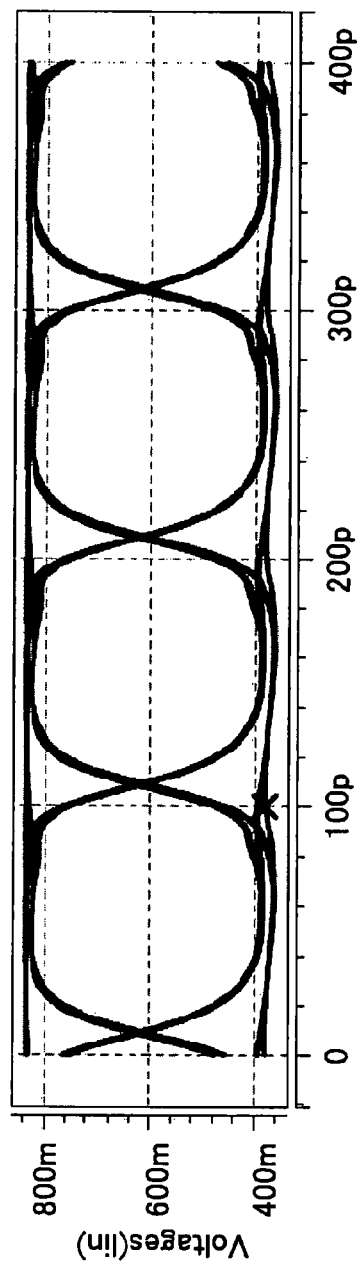

FIGS. 16A through 16C are drawings showing the results of computer simulation regarding circuit operation. The simulation results shown in FIGS. 16A through 16C are relevant to the operation of the circuit shown in FIG. 14. In this simulation, the circuit having the configuration shown in FIG. 15 is used for each the delay elements 80 and 81 of the jitter reduction circuit shown in FIG. 14.

FIG. 16A illustrates the waveform of a signal at the signal source. This waveform is directed to a single data signal having "0"s and "1"s appearing in a random manner, and is made by superimposing this data signal on itself multiple times for a period of several cycles. This data signal includes jitter, so that the timing of 0/1-signal-level transition is not aligned with a predetermined timing (i.e., the timing synchronized with a clock signal). Because of this, the multiple superimposition of the data signal for the period of several cycles results in the signal waveforms with timing fluctuation being superimposed on one another, so that multiple trace lines appear at the positions of signal level transition as shown in FIG. 16A.

FIG. 16B shows a signal waveform that appears at the input end when the signal shown in FIG. 16A is input into the signal transmission line 40 of FIG. 14. The waveform is distorted due to the effect of capacitance and inductance at the joint of the input end, resulting in the signal having a signal distortion in addition to the jitter.

FIG. 16C illustrates an output signal waveform that appears at an output node OUT of the signal transmission line 40 shown in FIG. 14. As illustrated, the jitter and waveform distortion of the signal are reduced, thereby presenting an extremely desirable data waveform.

Figure 17:
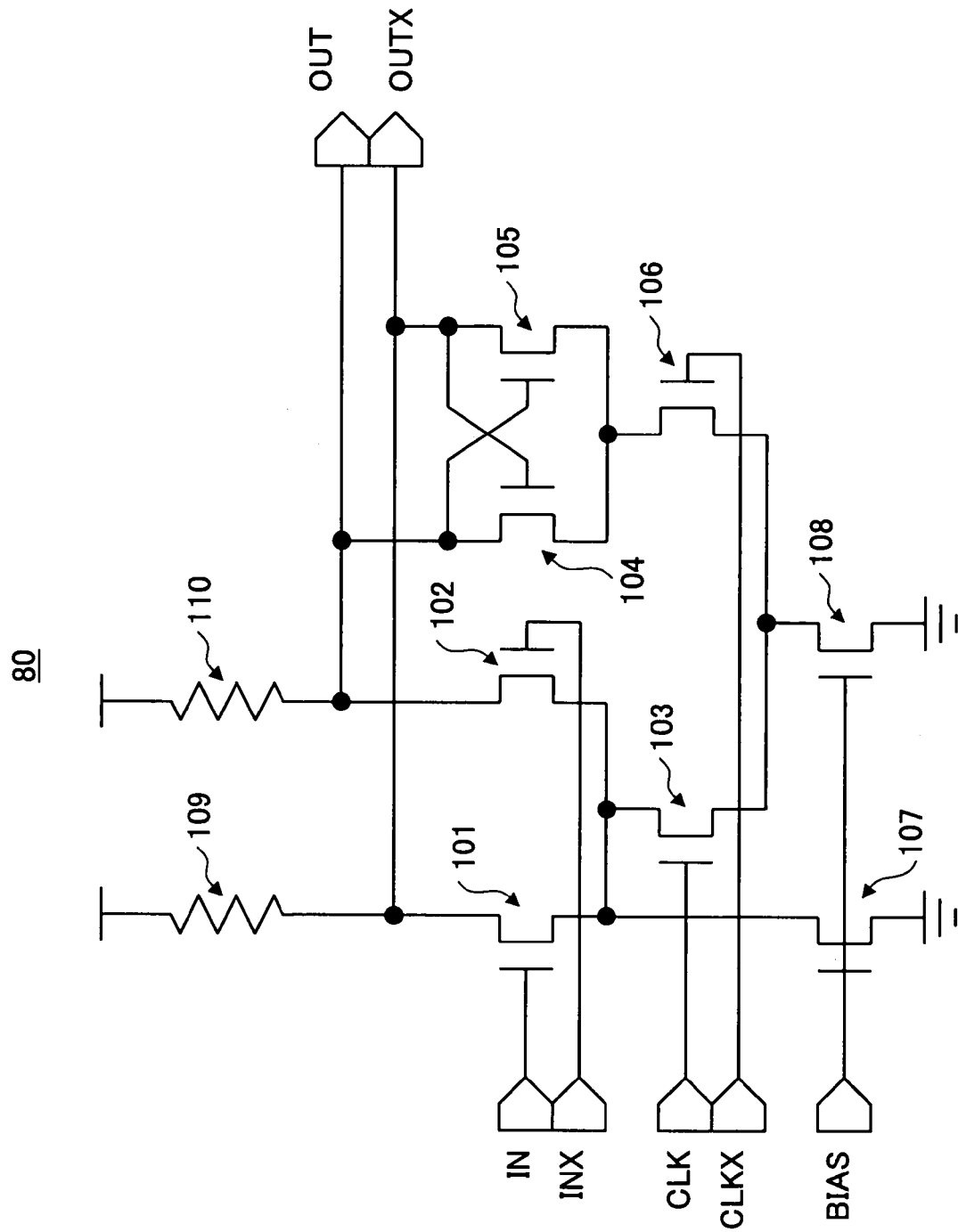
FIG. 17 is a drawing showing another example of the configuration of a delay element of FIG. 14.

FIG. 17 is a drawing showing another example of the configuration of a delay element 80 of FIG. 14. The circuit configuration of the delay elements 81 is the same as the circuit configuration of the delay elements 80.

The delay element 80 shown in FIG. 17 includes NMOS transistors 101 through 108 and resistors 109 and 110. The NMOS transistors 101 through 103 and the resistors 109 and 110 together constitute a differential amplifier that receives data signals IN and INX as its inputs. The NMOS transistors 104 through 106 constitute a positive-feedback amplifier (i.e., an amplifier whose input nodes and output nodes are the output nodes of the differential amplifier) that amplifies the output signal of the differential amplifier at the output nodes of the differential amplifier. The delay element 80 serves as an active-type delay element, through which the signal does not attenuate when propagating from the input to the output.

When the delay element 80 shown in FIG. 17 is used, each of the data signal and the clock signal is comprised of a pair of differential signals in the jitter reduction circuit shown in FIG. 14. Namely, the signal transmission line 40 for the propagation of a data signal includes a signal transmission line for transmitting a positive polarity data signal IN and a signal transmission line for transmitting a negative polarity data signal INX. Further, the signal transmission line 41 for the propagation of a clock signal includes a signal transmission line for transmitting a positive polarity clock signal CLK and a signal transmission line for transmitting a negative polarity clock signal CLKX.

A constant voltage is applied as a bias voltage BIAS in FIG. 17, so that the differential amplifier is operating at all time due to the constant current running through the transistor 107. The differential amplifier is driven by a large electric current resulting from the addition of an electric current running through the transistor 108 in addition to the above-noted constant current when the clock signal CLK is HIGH. The differential amplifier amplifies the data signals IN and INX, and outputs the amplified signals as output data signals OUT and OUTX of the delay element 80. The output data signals OUT and OUTX are supplied as the input data signals IN and INX to the next-stage delay element 80. During this time, the positive-feedback amplifier portion comprised of the NMOS transistors 104 through 106 is not operating.

When the clock signal CLK is LOW, the differential amplifier is driven by the electric current amount equal to that of the previously-noted constant current. The differential amplifier amplifies the data signals IN and INX, and outputs the amplified signals as output data signals OUT and OUTX of the delay element 80. The output data signals OUT and OUTX are supplied as the input data signals IN and INX to the next-stage delay element 80. During this time, the positive-feedback amplifier portion comprised of the NMOS transistors 104 through 106 operates in response to the HIGH state of CLKX, and amplifies and delays the output data signals OUT and OUTX. Accordingly, the delay from the input data signals IN and INX to the output data signals OUT and OUTX increases when the clock signal CLK is LOW, compared with when the clock signal CLK is HIGH.

In this manner, the propagation speed of the data signal on the signal transmission line 40 can be changed by changing the ratio of operations (i.e., the ratio of operating currents) between the differential amplifier for amplifying the data signals and the positive-feedback amplifier coupled to the outputs of the differential amplifier in response to the signal level of the clock signal on the signal transmission line 41. In the jitter reduction circuit shown in FIG. 14, an advantage that the attenuation of the signals on the signal transmission lines is eliminated is achieved by using an active-type delay element (or active delay cell) as shown in FIG. 17.

Figure 18:
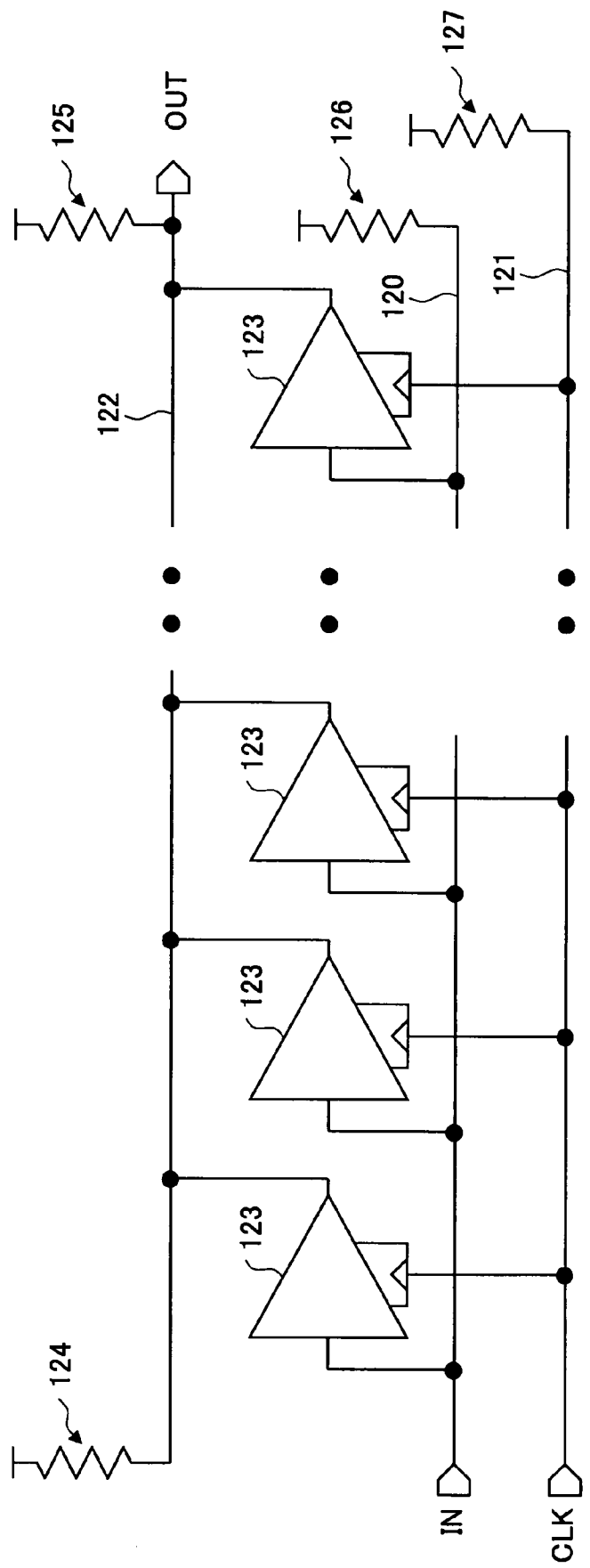
FIG. 18 is a drawing showing the configuration of another embodiment.

FIG. 18 is a drawing showing the configuration of another embodiment of the jitter reduction circuit according to the embodiment. The jitter reduction circuit shown in FIG. 18 includes a signal transmission line 120 for transmitting a data signal, a signal transmission line 121 for transmitting a clock signal, a signal transmission line 122 for transmitting a delayed data signal, a plurality of active-type delay elements 123, and resistors 124 through 127.

When the principle of the embodiment was described in connection with FIG. 2, it was noted that, instead of having the delay lines 20-1 through 20-n coupled in series to form one line, provision may alternatively be made such that the delay lines 20-1 through 20-n couple in parallel to each other between a signal line for the propagation of a data signal and another signal line. The circuit shown in FIG. 18 corresponds to such configuration.

In FIG. 18, the delay of the active-type delay elements 123 is determined in response to the signal level of the clock signal propagating through the signal transmission line 121. For example, the delay of the active-type delay elements 123 is set to a first delay when the clock signal is HIGH, and is set to a second delay larger than the first delay when the clock signal is LOW. The active-type delay elements 123 are coupled at their inputs to respective positions along the signal transmission line 120, and are coupled at their outputs to respective positions along the signal transmission line 122. The active-type delay elements 123 delay the data signals supplied from the signal transmission line 120, and supply the delayed data signals to the signal transmission line 122.

Figure 19:
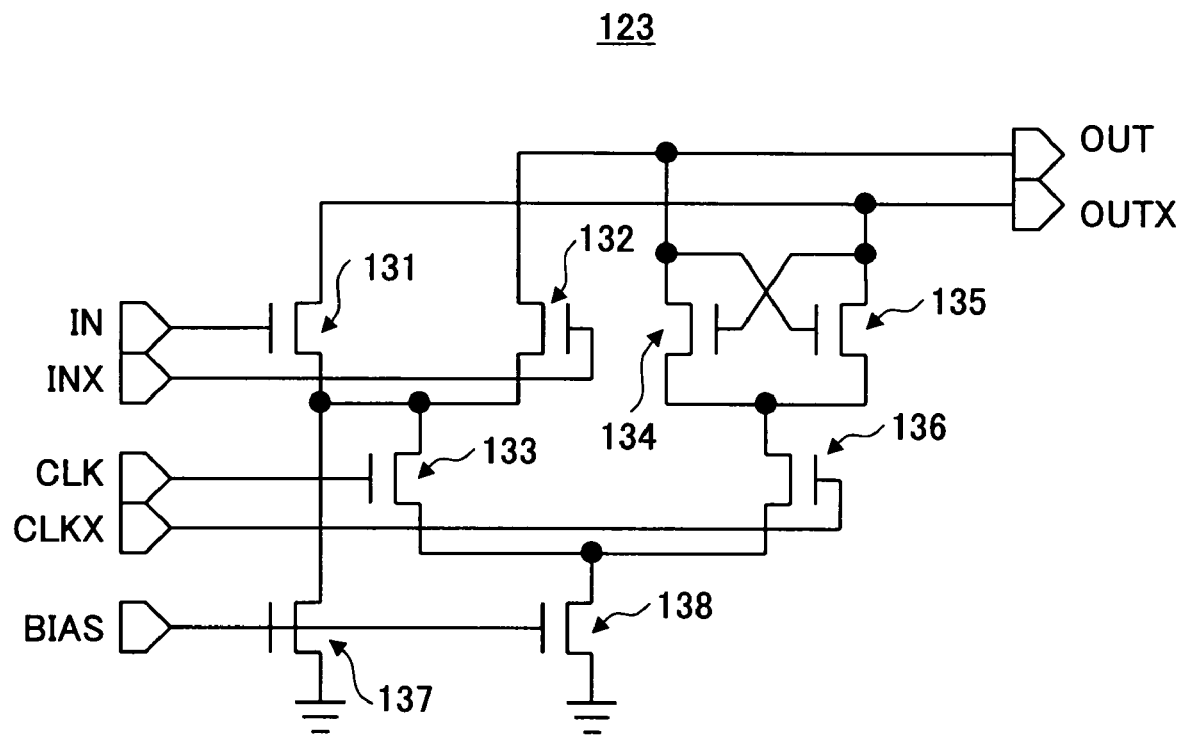
FIG. 19 is a drawing showing an example of the configuration of a delay element of FIG. 18.

FIG. 19 is a drawing showing an example of the configuration of a delay element 123 of FIG. 18. The delay element 123 shown in FIG. 19 includes NMOS transistors 131 through 138. The NMOS transistors 131 through 133 and the resistors 124 and 125 coupled to the signal transmission line 122 together constitute a differential amplifier that receives data signals IN and INX as its inputs. The NMOS transistors 134 through 136 are coupled to the outputs of the differential amplifier and serve as a delay element.

When the active-type delay element 123 shown in FIG. 19 is used, each of the data signal and the clock signal is comprised of a pair of differential signals in the jitter reduction circuit shown in FIG. 18. Namely, the signal transmission line 120 for transmitting an input-side data signal includes a signal transmission line for transmitting a positive polarity data signal IN and a signal transmission line for transmitting a negative polarity data signal INX. Further, the signal transmission line 121 for the propagation of a clock signal includes a signal transmission line for transmitting a positive polarity clock signal CLK and a signal transmission line for transmitting a negative polarity clock signal CLKX. Further, the signal transmission line 122 for transmitting an output-side data signal includes a signal transmission line for transmitting a positive polarity data signal OUT and a signal transmission line for transmitting a negative polarity data signal OUTX.

In the configuration shown in FIG. 18 and FIG. 19, the respective delays of data signals that are superimposed on one another upon merging on the signal transmission line 122 are changed in response to the signal levels of the clock signal on the signal transmission line 121. With this arrangement, the phase of the data signal is changed in response to the signal level of the clock signal, thereby providing the effect of reducing the jitter of the data signal as in the previously described embodiments. In this configuration, the active-type delay elements 123 serve as trance conductors so that the outputs thereof drive the signal transmission line 122 in a distributed manner. Such distributed amplifiers are advantageous in that a high frequency band is achieved due to a minimized effect of parasitic capacitance resulting from the fact that the input and output capacitances of the amplifiers are incorporated in the parallel capacitances of the transmission line.

Figure 20:
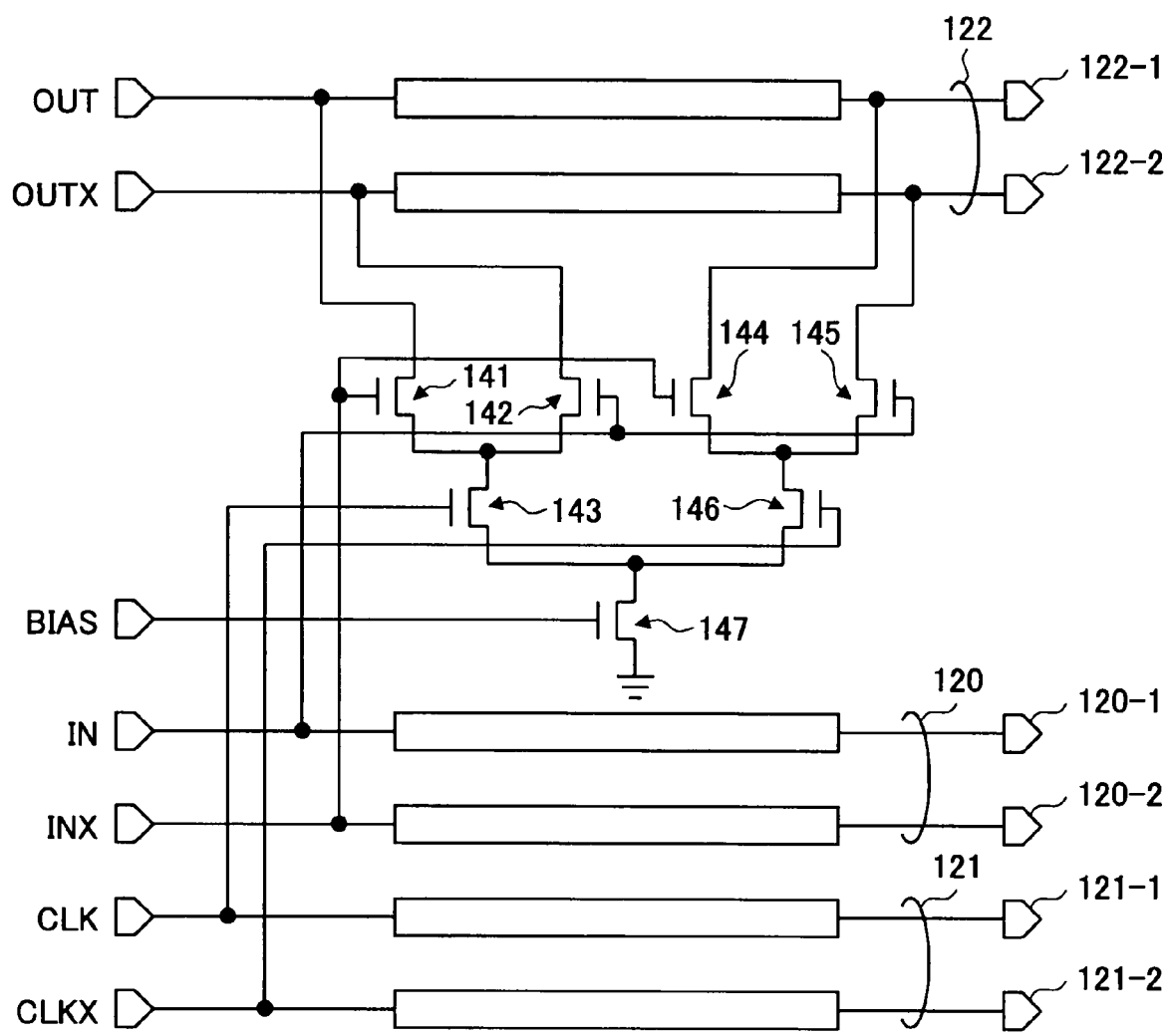
FIG. 20 is a drawing showing the configuration of another embodiment.

FIG. 20 is a drawing showing the configuration of another embodiment of the jitter reduction circuit according to the embodiment. In FIG. 20, the same elements as those of FIG. 18 are referred to by the same numerals, and a description thereof will be omitted.

The jitter reduction circuit shown in FIG. 20 includes the signal transmission line 120 for transmitting a data signal, the signal transmission line 121 for transmitting a clock signal, the signal transmission line 122 for transmitting a delayed data signal, and NMOS transistors 141 through 147.

In the jitter reduction circuit shown in FIG. 20, each of the data signal and the clock signal is a pair of differential signals. Namely, the signal transmission line 120 for transmitting an input-side data signal includes a signal transmission line 120-1 for transmitting a positive polarity data signal IN and a signal transmission line 120-2 for transmitting a negative polarity data signal INX. Further, the signal transmission line 121 for the propagation of a clock signal includes a signal transmission line 121-1 for transmitting a positive polarity clock signal CLK and a signal transmission line 121-2 for transmitting a negative polarity clock signal CLKX. Further, the signal transmission line 122 for transmitting an output-side data signal includes a signal transmission line 122-1 for transmitting a positive polarity data signal OUT and a signal transmission line 122-2 for transmitting a negative polarity data signal OUTX.

What is shown in FIG. 20 is a portion corresponding to one of the sections constituting the signal transmission lines, and circuits each identical to the configuration shown in FIG. 20 are coupled in series for multiple stages, thereby forming the signal transmission lines comprised of a plurality of sections. In each section, the NMOS transistors 141 through 143 form a first differential amplifier that receives data signals IN and INX as its inputs. Further, the NMOS transistors 144 through 146 form a second differential amplifier that receives the data signals IN and INX as its inputs. What differs from the configuration of the jitter reduction circuit shown in FIG. 18 is that the first and second differential amplifiers are provided in place of each of the active-type delay elements 123 shown in FIG. 18.

The first differential amplifier operates when the clock signal CLK is HIGH, and the second differential amplifier operates when the clock signal CLKX is HIGH. The output of the first differential amplifier is coupled to the input end of the corresponding section of the signal transmission line 122, and the output of the second differential amplifier is coupled to the output end of this corresponding section. With this arrangement, the delay of a data signal propagating through the signal transmission line 122 is changed in response to the signal level of the clock signal. The configuration shown in FIG. 20 offers an advantage in that the control of delay can be accurately performed without being affected by device variation because the delay is determined by the positions of coupling points on the transmission line.

Figure 21:
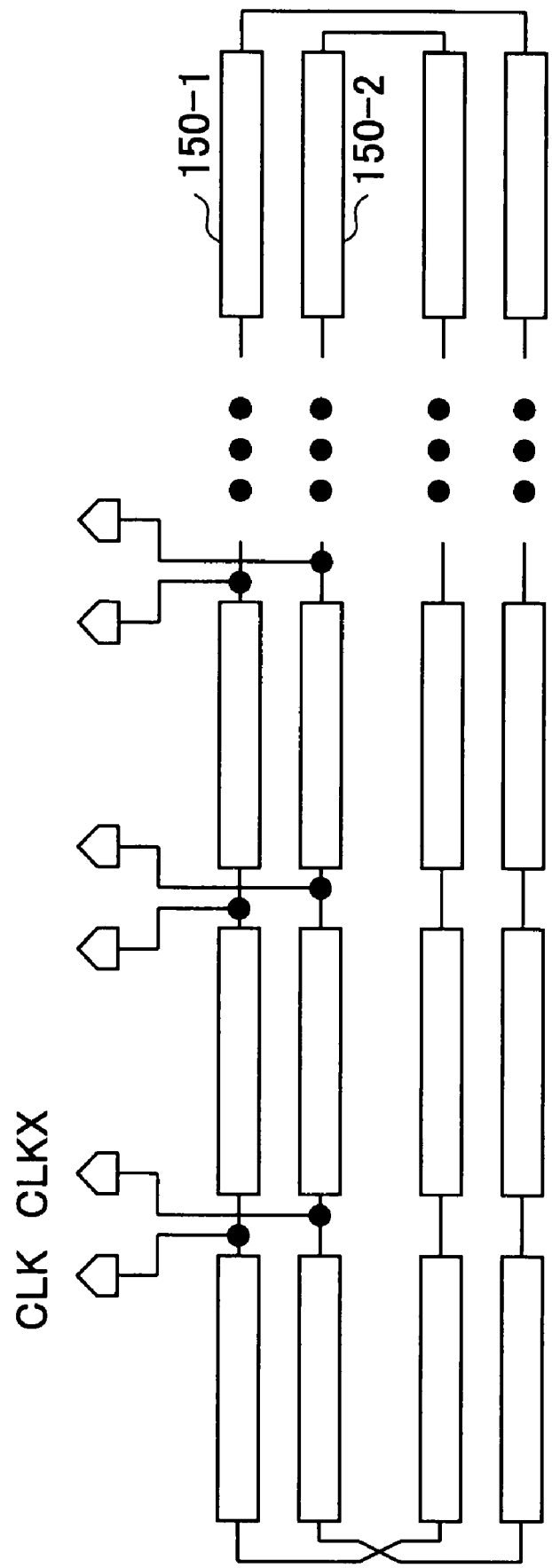
FIG. 21 is a drawing showing an example of the configuration of a signal transmission line for transmitting a clock signal for use in the jitter reduction circuit of the embodiments.

FIG. 21 is a drawing showing an example of the configuration of a signal transmission line for transmitting a clock signal for use in the jitter reduction circuit of the embodiment. The signal transmission line for transmitting a clock signal shown in FIG. 21 includes a signal transmission line 150-1 for transmitting a positive polarity clock signal CLK and a signal transmission line 150-2 for transmitting a negative polarity clock signal CLKX. The signal transmission lines 150-1 and 150-2 have the head end coupled to the tail end to form a loop.

Figure 22:
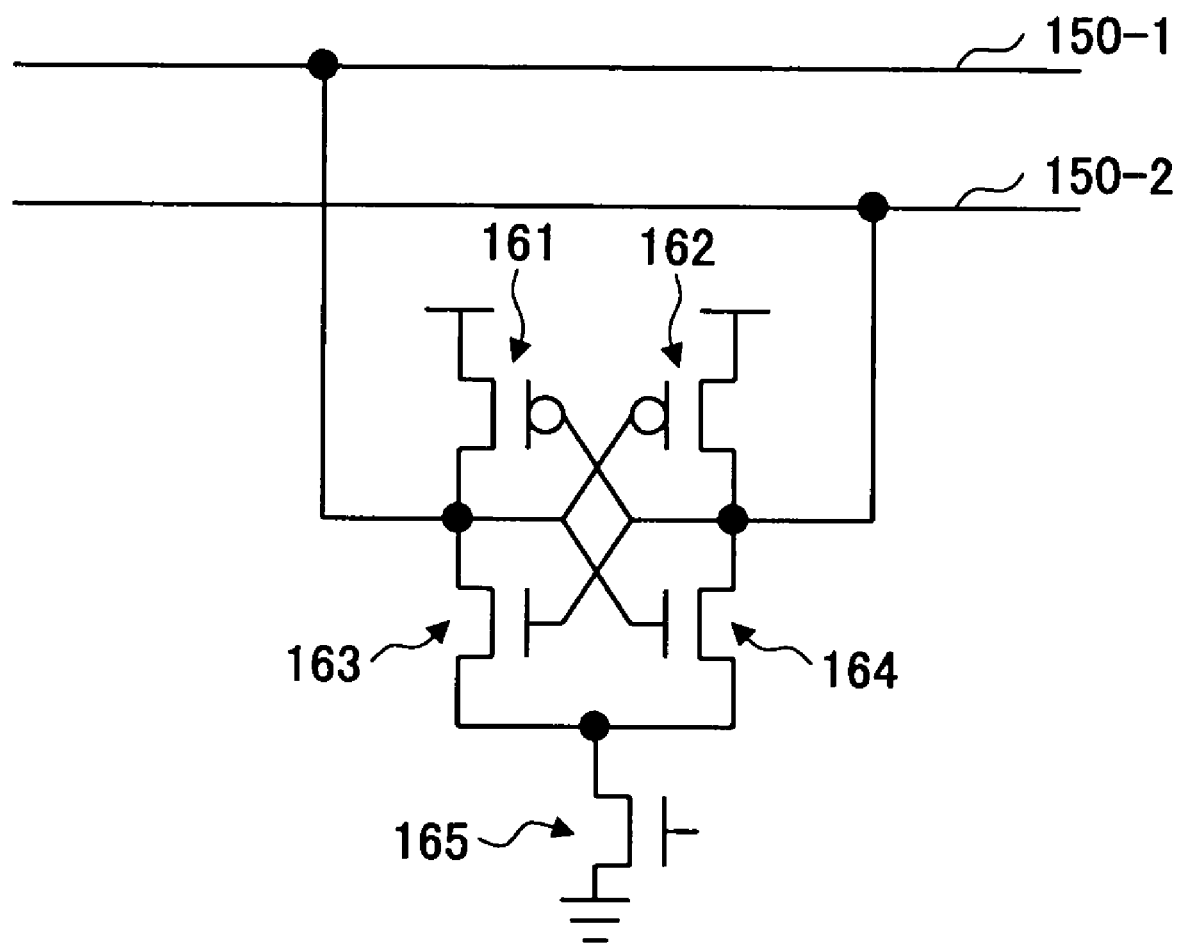
FIG. 22 is a drawing showing the configuration of a negative conductor coupled to the signal transmission lines for transmitting a clock signal shown in FIG. 21.

FIG. 22 is a drawing showing the configuration of a negative conductor coupled to the signal transmission lines for transmitting a clock signal shown in FIG. 21. The negative conductor includes PMOS transistors 161 and 162 and NMOS transistors 163 through 165. The coupling of such negative conductor to the signal transmission lines 150-1 and 150-2 serves to compensate for the loss of the clock signal. A circuit to be coupled is not limited to a negative conductor, and may be any circuit that can serve to compensate for signal loss.

The use of the signal transmission lines for transmitting a clock signal as shown in FIG. 21 and FIG. 22 ensures that the clock signal circulates through the loop of the signal transmission lines without being absorbed by terminating resistors, thereby substantially reducing power consumption in the clock system. The signal transmission lines having such loop shape may be used as the signal transmission line for conducting a clock signal in any one of the embodiments described heretofore. Some of these embodiments have been described with reference to a case in which the clock signal is not shown as differential signals. However, a choice between differential signals and a singular signal is a matter of design choice, and one having ordinary skill in the art would easily recognize that any of these embodiments can be implemented by use of differential signals.

Figure 23:
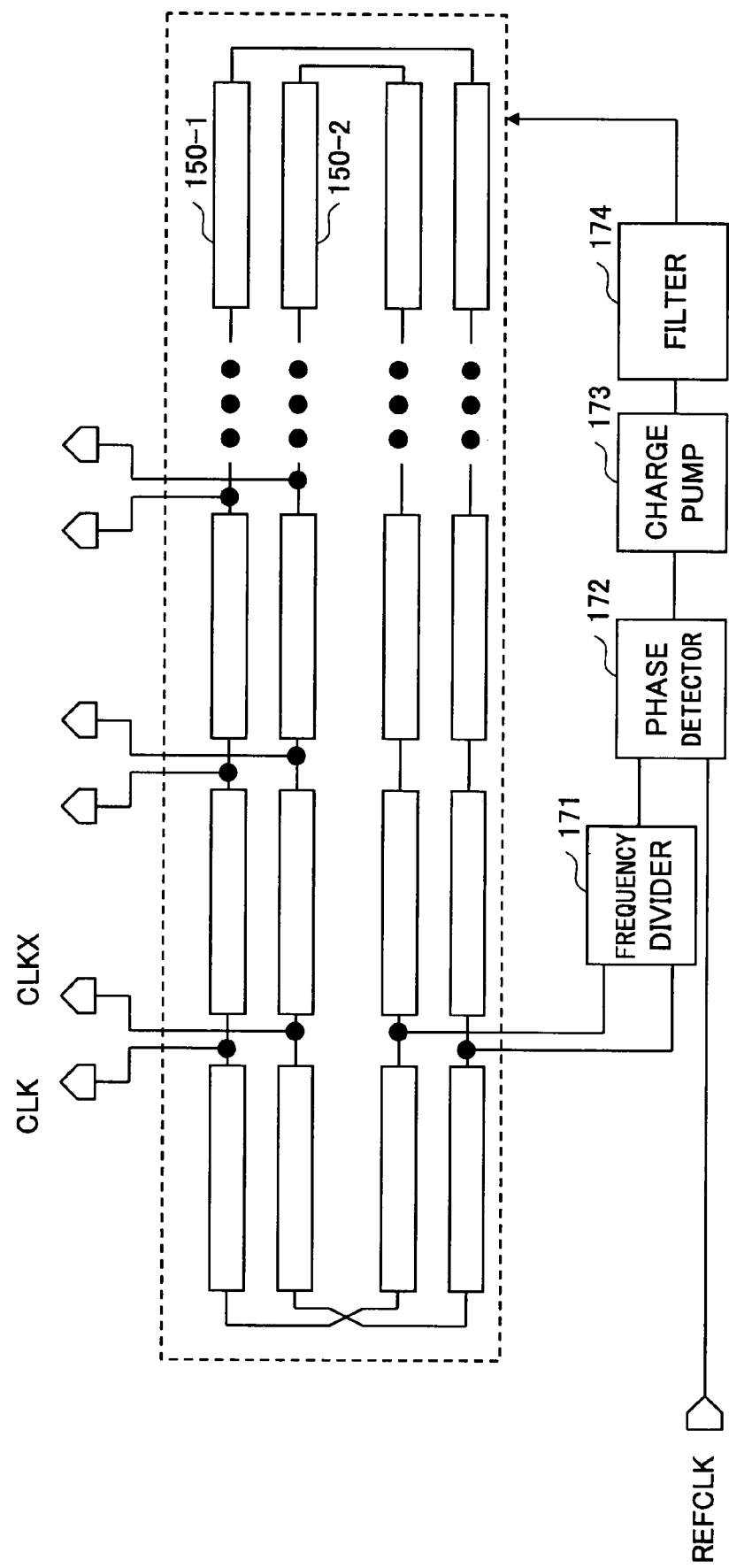
FIG. 23 is a drawing showing another example of the configuration of a signal transmission line for transmitting a clock signal for use in the jitter reduction circuit of the embodiments.

FIG. 23 is a drawing showing another example of the configuration of a signal transmission line for transmitting a clock signal for use in the jitter reduction circuit of the embodiment. In FIG. 23, the same elements as those of FIG. 21 are referred to by the same numerals, and a description thereof will be omitted.

In the configuration shown in FIG. 23, the looped signal transmission lines 150-1 and 150-2 are provided with the function to control clock frequency by use of a PLL circuit. The PLL circuit includes a frequency divider 171, a phase detector 172, a charge pump 173, and a low-pass filter 174. The frequency divider 171 divides the frequency of the clock signal propagating through the signal transmission lines 150-1 and 150-2 so as to generate a signal having ⅛ as high frequency, for example. The phase detector 172 compares phases between the frequency-divided clock signal output from the frequency divider 171 and a reference clock signal REFCLK to produce a detection result indicative of phase advancement/delay. The charge pump 173 generates a voltage signal whose voltage level changes in response to the output of the phase detector 172. The low-pass filter 174 performs filtering with respect to the output signal of the charge pump 173 to remove high-frequency components, and supplies the filtered signal to the node for controlling the delays of the signal transmission lines 150-1 and 150-2.

The signal transmission lines 150-1 and 150-2 is provided with a delay control element, having the node for delay control, to which the output of the low-pass filter 174 is supplied to control the phase of the clock signal. This achieves feedback control, so that the clock signal propagating through the signal transmission lines 150-1 and 150-2 can be set to 8 times as high frequency as the reference clock signal REFCLK, for example. The above-noted node for delay control may be the node for receiving V2 in FIG. 1, the node for receiving Vref in FIG. 11, the node for receiving Vref in FIG. 14, or the like.

In the configuration shown in FIG. 23, the clock frequency input into the jitter reduction circuit from an external source can be low compared with the data frequency, which advantageously makes it easier to implement the jitter reduction circuit on a chip or on a board.

Features and advantages of the embodiment will be realized and attained by a jitter reduction circuit particularly pointed out in the specification in such full, clear, concise, and exact terms as to enable a person having ordinary skill in the art to practice the embodiment.

Further, the present invention is not limited to these embodiments, but various variations and modifications may be made without departing from the scope of the present invention.

What is claimed is:

1. A jitter reduction circuit, comprising:
a signal line transmitting a first signal and having a plurality of sections; and
a plurality of delay lines transmitting a second signal and provided in one-to-one correspondence to the sections of the signal line,
wherein one of the plurality of sections includes a first amplifier circuit which receives the corresponding first signal and outputs an amplified first signal, and one of the plurality of delay lines, which corresponds to the one of the plurality of sections, includes a first delay element which is controlled based on the amplified first signal.

2. The jitter reduction circuit as claimed in claim 1, wherein the delay lines are coupled in series to form one line transmitting the second signal.

3. The jitter reduction circuit as claimed in claim 2, wherein the first delay element receives a signal level corresponding to the first signal as an input and has a delay of the first delay element changing in response to the input, such that the first delay element controls a delay of the second signal, and the signal line includes a second delay element having a substantially identical configuration to the first delay element and receiving a signal having a midpoint level between a high level and a low level of the first signal.

4. The jitter reduction circuit as claimed in claim 2, further comprising a second amplifier circuit configured to amplify the second signal, wherein the delay lines are configured such that a passive device controls the delay of the second signal.

5. The jitter reduction circuit as claimed in claim 2, further comprising a negative conductor coupled to the plurality of delay lines, wherein the delay lines are configured such that a passive device controls the delay of the second signal.

6. The jitter reduction circuit as claimed in claim 2, wherein each of the delay lines includes:
an amplifier; and
a variable resistor coupled in series to the amplifier and having a controllable resistance.

7. The jitter reduction circuit as claimed in claim 2, wherein each of the delay lines includes:
a first amplifier configured to produce at an output node thereof an amplified signal made by amplifying the second signal received as an input; and
a second amplifier configured to amplify at the output node the amplified signal produced at the output node,
wherein a ratio of an operating current of the first amplifier to an operating current of the second amplifier is configured to change in response to a level of the first signal.

8. The jitter reduction circuit as claimed in claim 1, further comprising:
a signal input line to which input ends of the delay lines are coupled at respective positions; and
a signal output line to which output ends of the delay lines are coupled at respective positions,
wherein each of the delay lines is an active-type delay element.

9. The jitter reduction circuit as claimed in claim 8, wherein each of the delay lines includes:
a first amplifier having an input node coupled to the signal input line and having an output node coupled to the signal output line at a first position; and
a second amplifier having an input node coupled to the signal input line and having an output node coupled to the signal output line at a second position,
wherein the first amplifier and the second amplifier are configured such that either one of the first amplifier and the second amplifier is selectively driven in response to a level of the first signal.

10. The jitter reduction circuit as claimed in claim 1, further comprising a circuit coupled to the signal line and configured to compensate for the first signal on the signal line, wherein the signal line has one end thereof coupled to another end thereof to form a loop.

11. The jitter reduction circuit as claimed in claim 10, further comprising a PLL circuit configured to set a frequency of the first signal by referring to a signal frequency supplied from an external source.

12. A jitter reduction circuit, comprising:
a signal line transmitting a first signal and having a plurality of sections; and
a plurality of delay lines transmitting a second signal and provided in one-to-one correspondence to the sections of the signal line,
wherein the plurality of delay lines is configured such that a delay of the second signal on one of the delay lines is set to a first delay in response to a first level of the first signal in a corresponding one of the sections, and is set to a second delay in response to a second level of the first signal in the corresponding one of the sections,
an amplifier circuit configured to amplify the second signal, wherein the delay lines are configured such that a passive device controls the delay of the second signal.

13. The jitter reduction circuit as claimed in claim 12, wherein the delay lines are coupled in series to form one line transmitting the second signal.

* * * * *